United States Patent
Takamura

(10) Patent No.: US 7,793,191 B2
(45) Date of Patent: Sep. 7, 2010

(54) INTERLEAVE DEVICE, INTERLEAVING METHOD, DEINTERLEAVE DEVICE, AND DEINTERLEAVE METHOD

(75) Inventor: Mototsugu Takamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1429 days.

(21) Appl. No.: 10/510,118

(22) PCT Filed: Apr. 3, 2003

(86) PCT No.: PCT/JP03/04279
§ 371 (c)(1),
(2), (4) Date: Jun. 9, 2005

(87) PCT Pub. No.: WO03/085838
PCT Pub. Date: Oct. 16, 2003

(65) Prior Publication Data
US 2005/0251726 A1 Nov. 10, 2005

(30) Foreign Application Priority Data
Apr. 5, 2002 (JP) .............................. 2002-104581

(51) Int. Cl.
*H03M 13/00* (2006.01)
(52) U.S. Cl. .................. 714/755; 714/701; 714/764; 714/784
(58) Field of Classification Search .................. 714/755, 714/756, 768, 775, 718, 779, 701, 764
See application file for complete search history.

(56) References Cited

U.S. PATENT DOCUMENTS

| 5,140,596 | A | * | 8/1992 | Weldon, Jr. ................. 714/762 |
| 5,732,088 | A | * | 3/1998 | Sako .......................... 714/701 |
| 6,035,433 | A | * | 3/2000 | Sako et al. ................... 714/764 |
| 6,826,181 | B1 | * | 11/2004 | Higashida et al. ........... 370/390 |
| 6,834,364 | B2 | * | 12/2004 | Krech et al. .................. 714/45 |
| 6,851,076 | B1 | * | 2/2005 | Cook et al. .................. 714/718 |
| 2003/0225985 | A1 | * | 12/2003 | Suzuki et al. ............... 711/157 |

FOREIGN PATENT DOCUMENTS

| EP | 1 083 660 | 3/2001 |
| EP | 1 227 596 | 7/2002 |
| EP | 1 241 796 | 9/2002 |
| JP | 1 106336 | 4/1989 |
| JP | 7 212250 | 8/1995 |

(Continued)

*Primary Examiner*—Fritz Alphonse
(74) *Attorney, Agent, or Firm*—Frommer Lawrence & Haug LLP; William S. Frommer; Ellen Marcie Emas

(57) ABSTRACT

An encoder in a data transmission/reception system has a byte interleaver for performing folding interleaving on encoded data ED in units of a byte and a packet interleaver for performing folding interleaving, in units of a packet, on byte interleave data BID generated by this byte interleaver. A decoder has a packet de-interleaver for performing folding de-interleaving, in units of a packet, on packet interleave data PID' and a byte de-interleaver for performing folding de-interleaving, in units of a byte, on byte interleave data BID' generated by this packet de-interleaver. It is thus possible to correct a significant burst error containing a packet loss even with an error correction code having a very small code length.

18 Claims, 24 Drawing Sheets

FOREIGN PATENT DOCUMENTS

| | | |
|---|---|---|
| JP | 11-177642 | 7/1999 |
| JP | 2001-127796 | 5/2001 |
| JP | 2001 266501 | 9/2001 |
| JP | 2002-520938 | 7/2002 |
| WO | WO 00/03486 | 1/2000 |
| WO | WO 00/48323 | 8/2000 |
| WO | WO 01 76079 | 10/2001 |

* cited by examiner

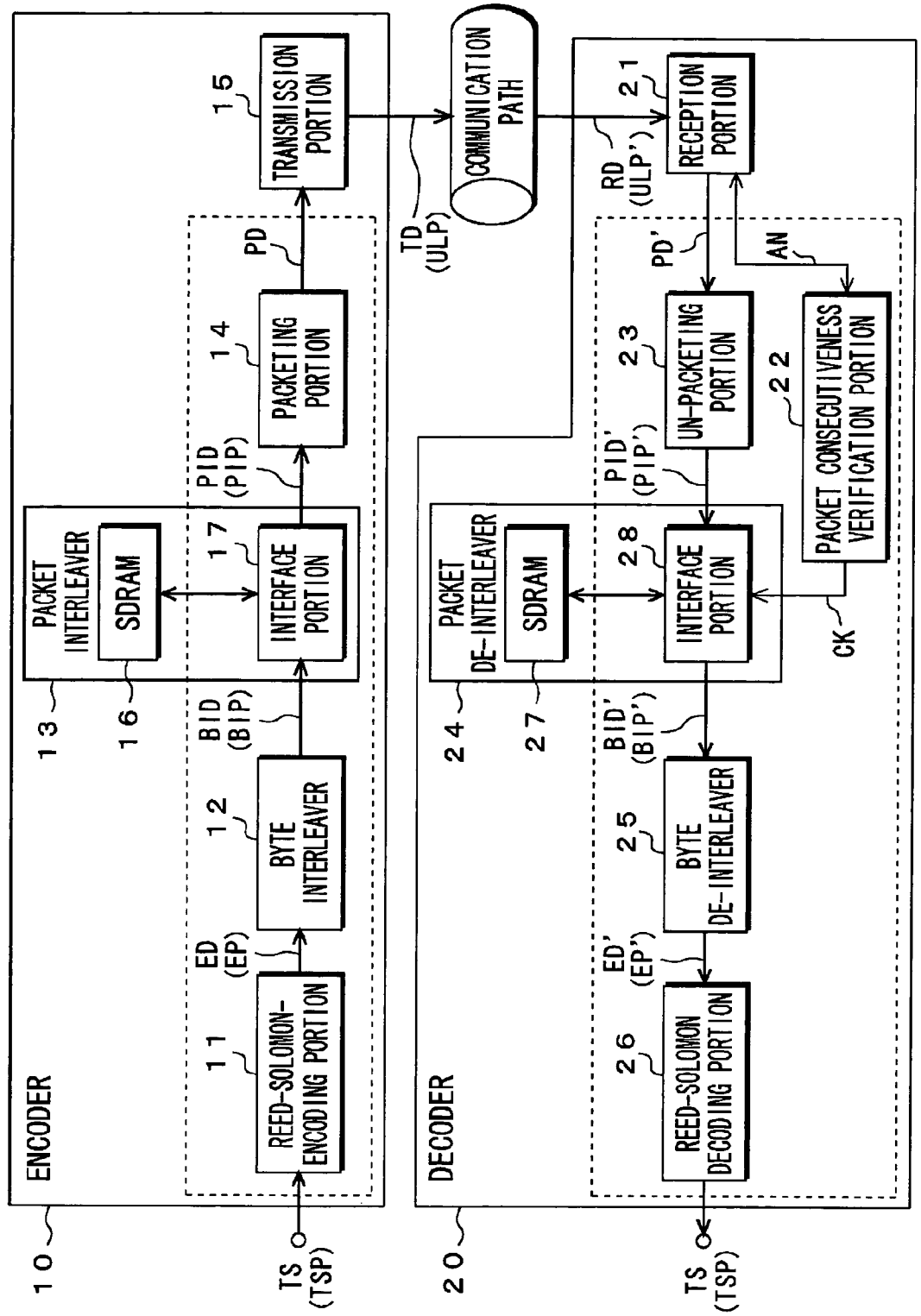

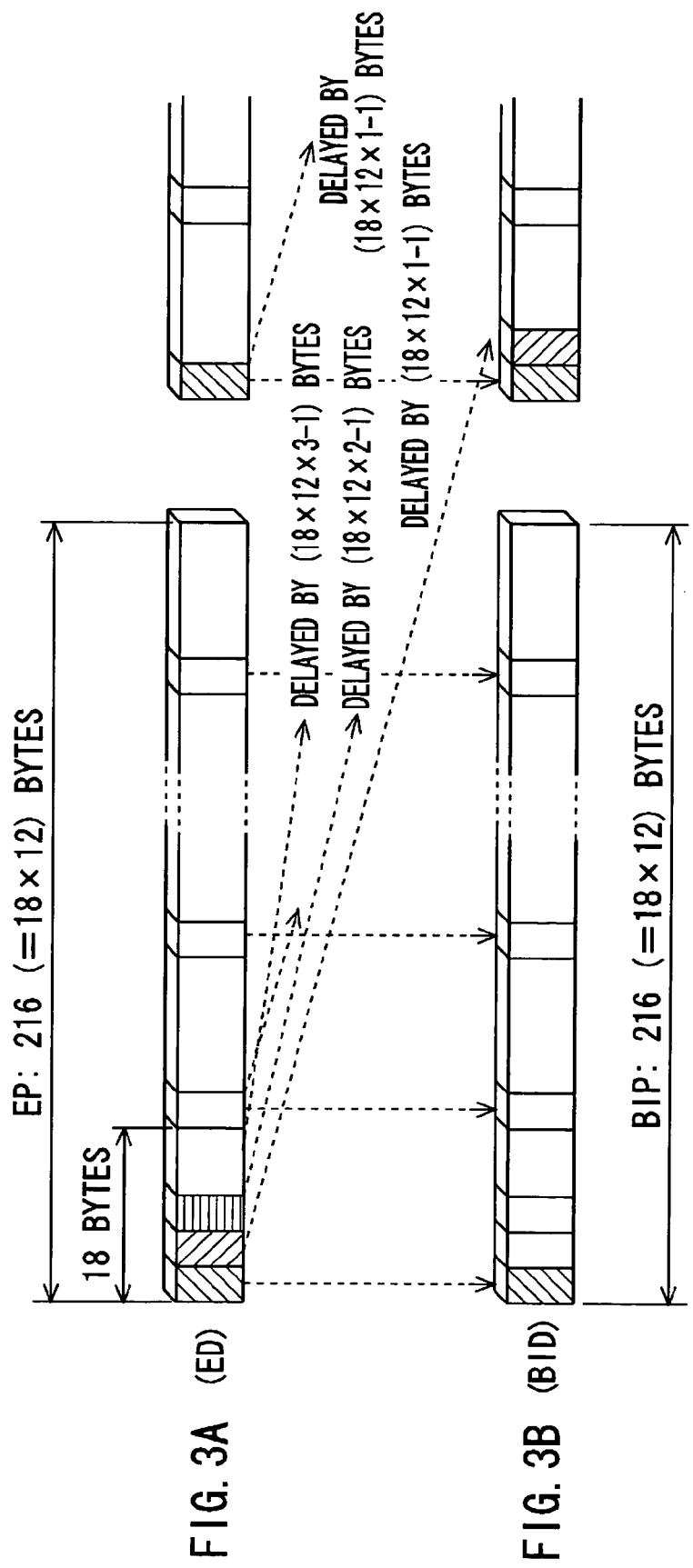

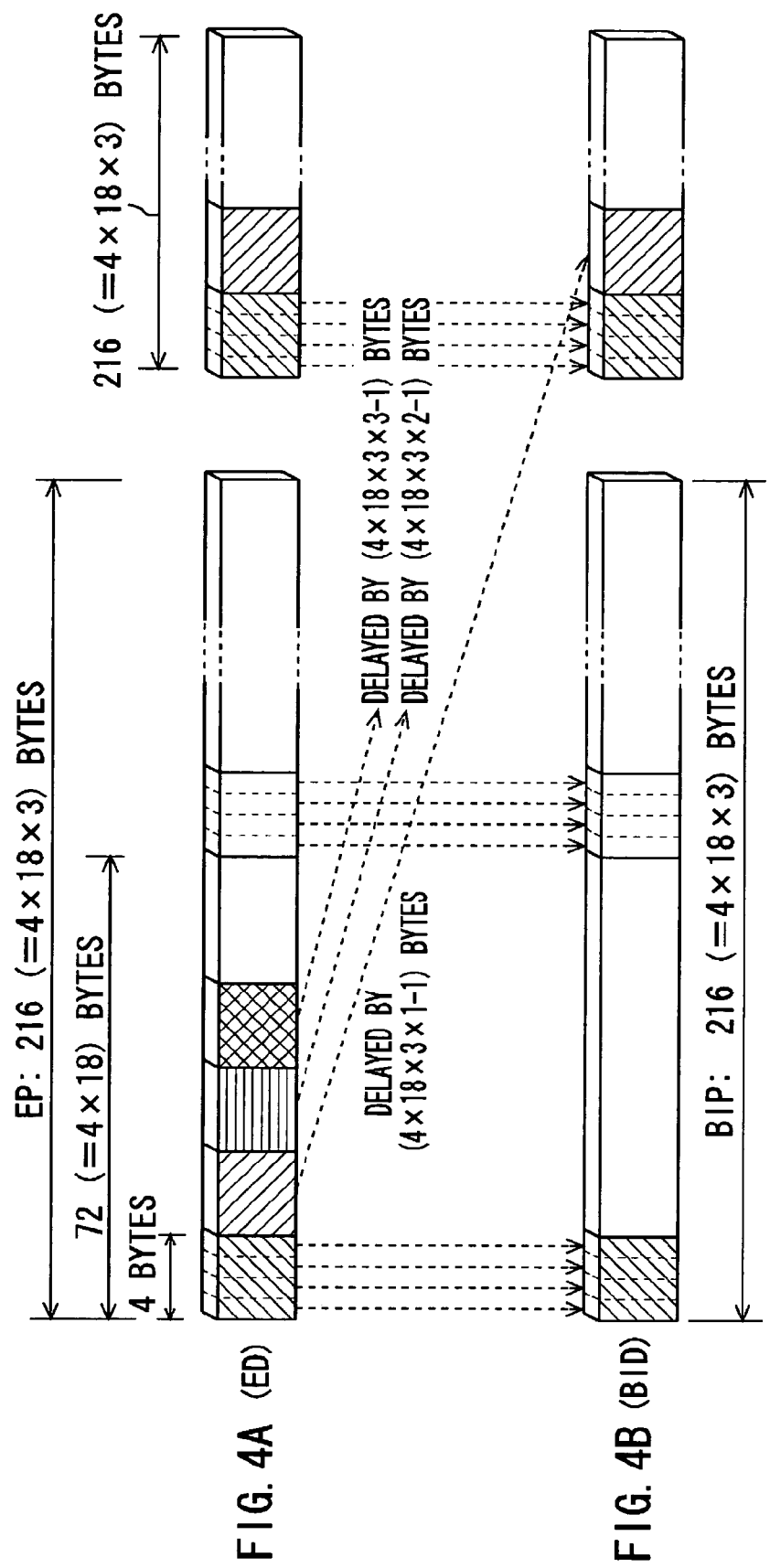

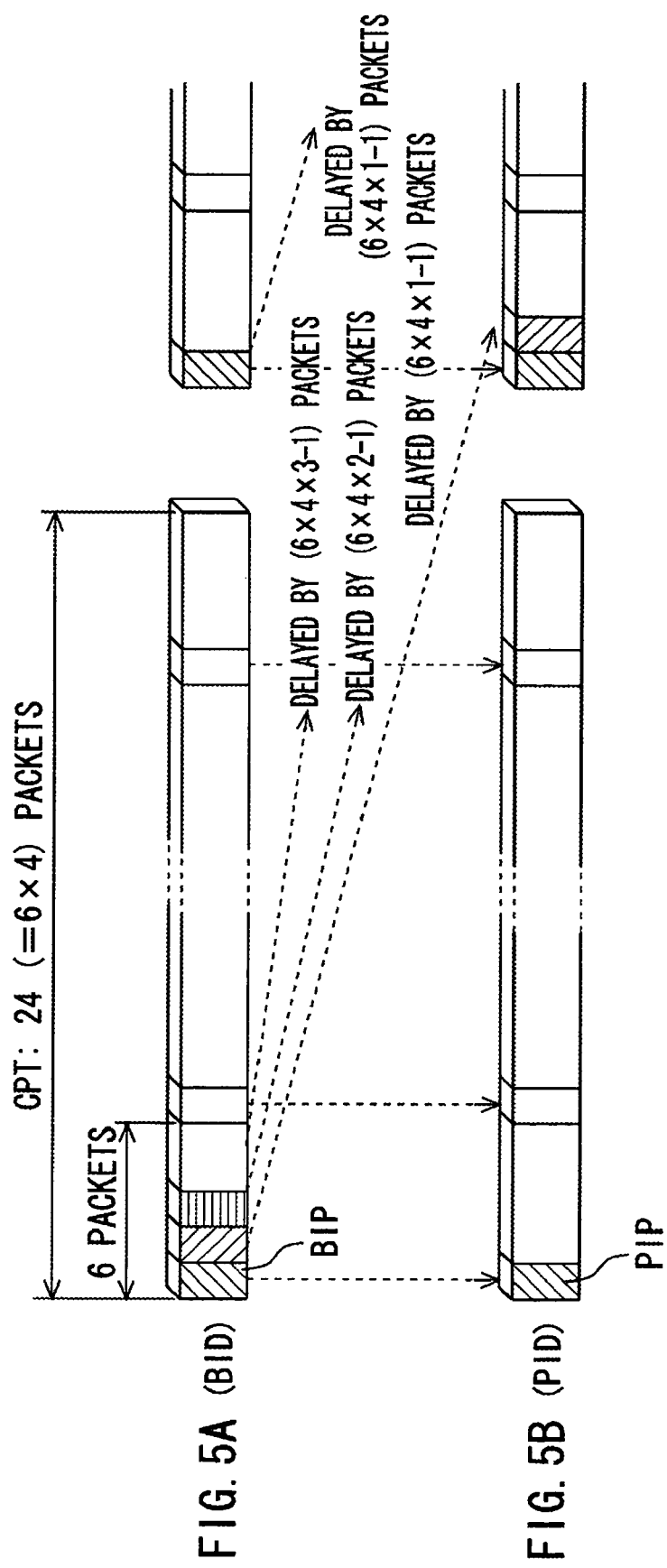

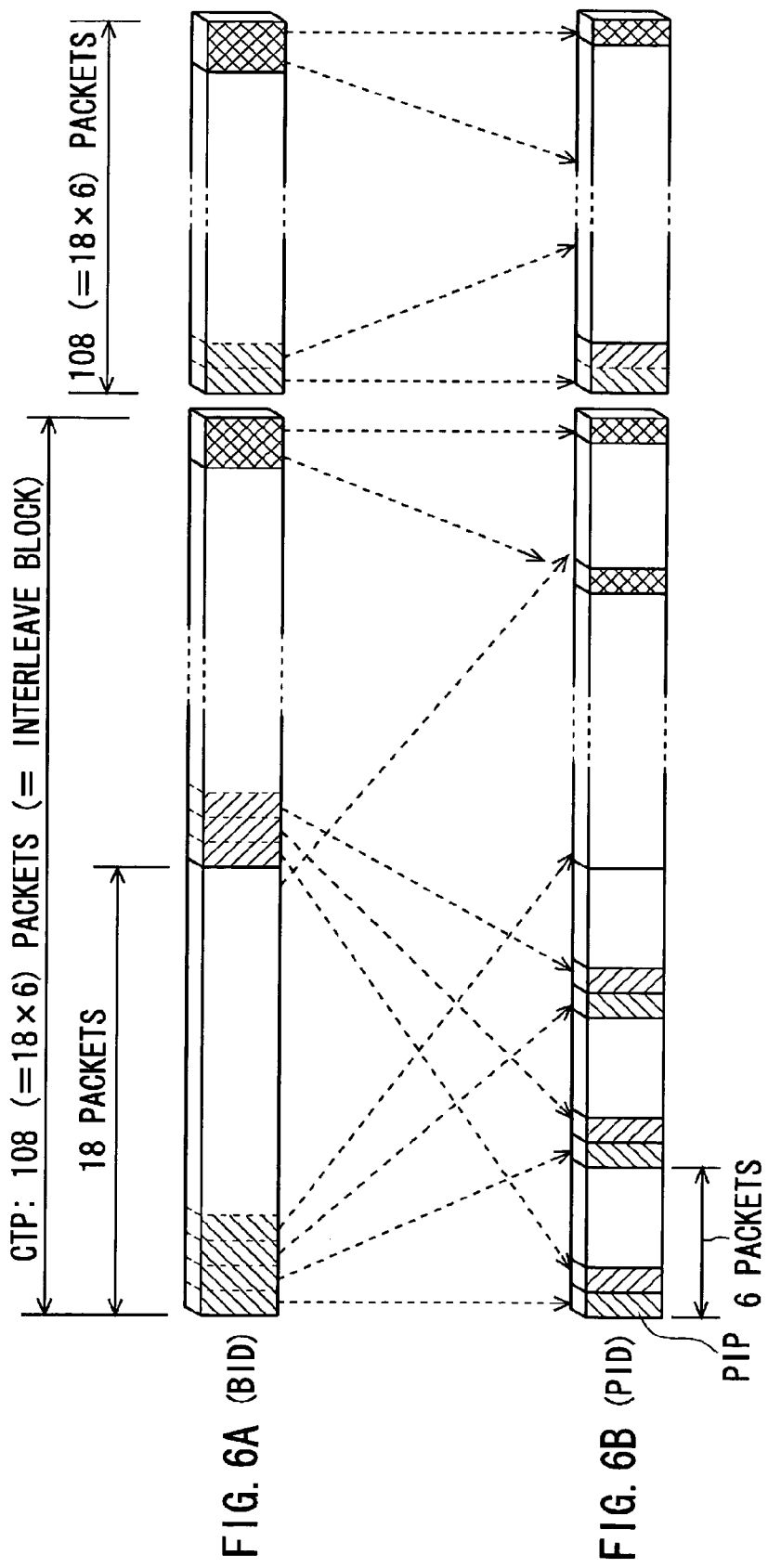
FIG. 6A (BID)   FIG. 6B (PID)

FIG. 7A (EP)

FIG. 7B (BIP)

18 PACKETS

FIG. 7C (PIP)

FIG 7D (PD)

FIG. 8A (EP)
FIG. 8B (BIP)
FIG. 8C (PIP)
FIG. 8D (PD)
FIG. 8E (PD)

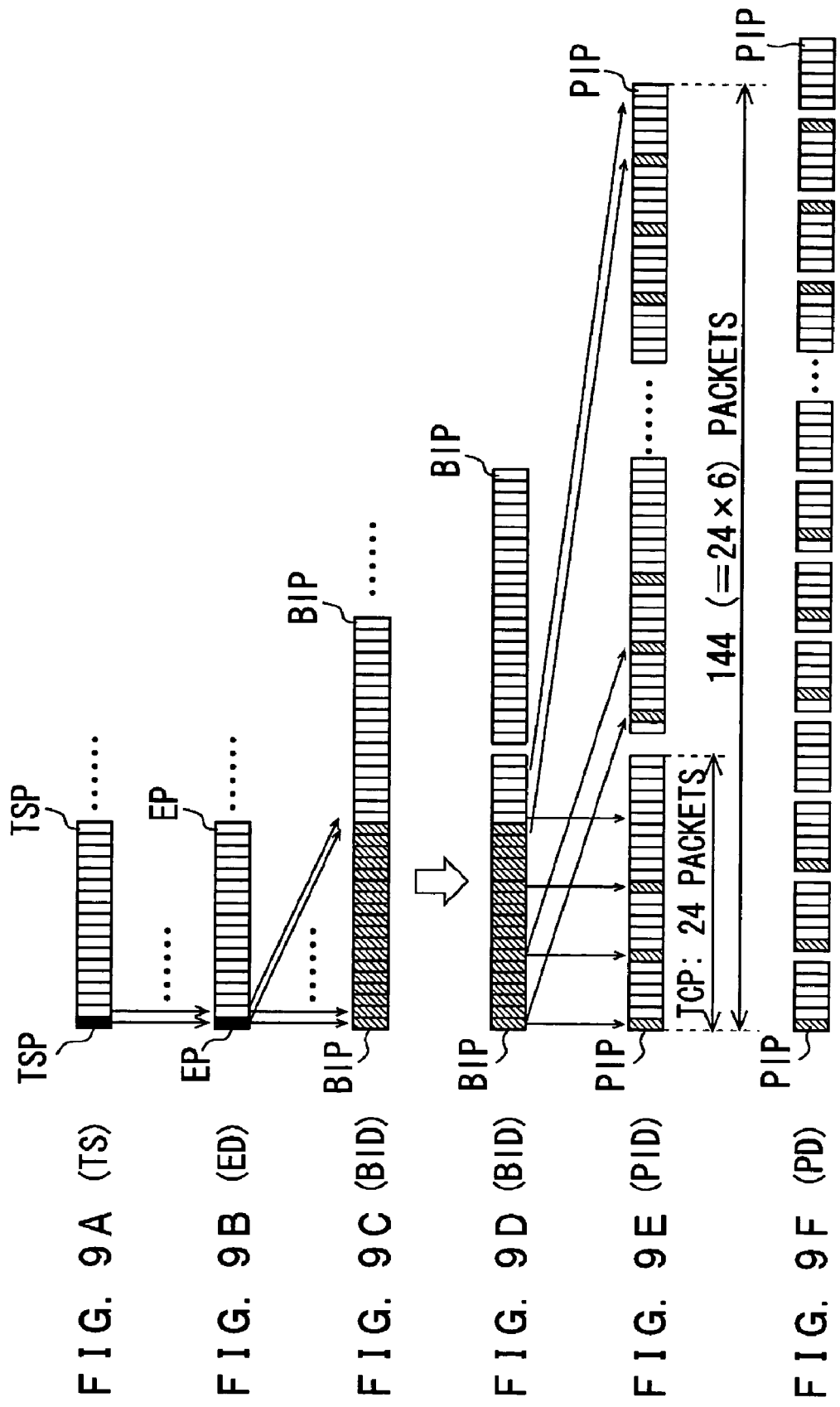

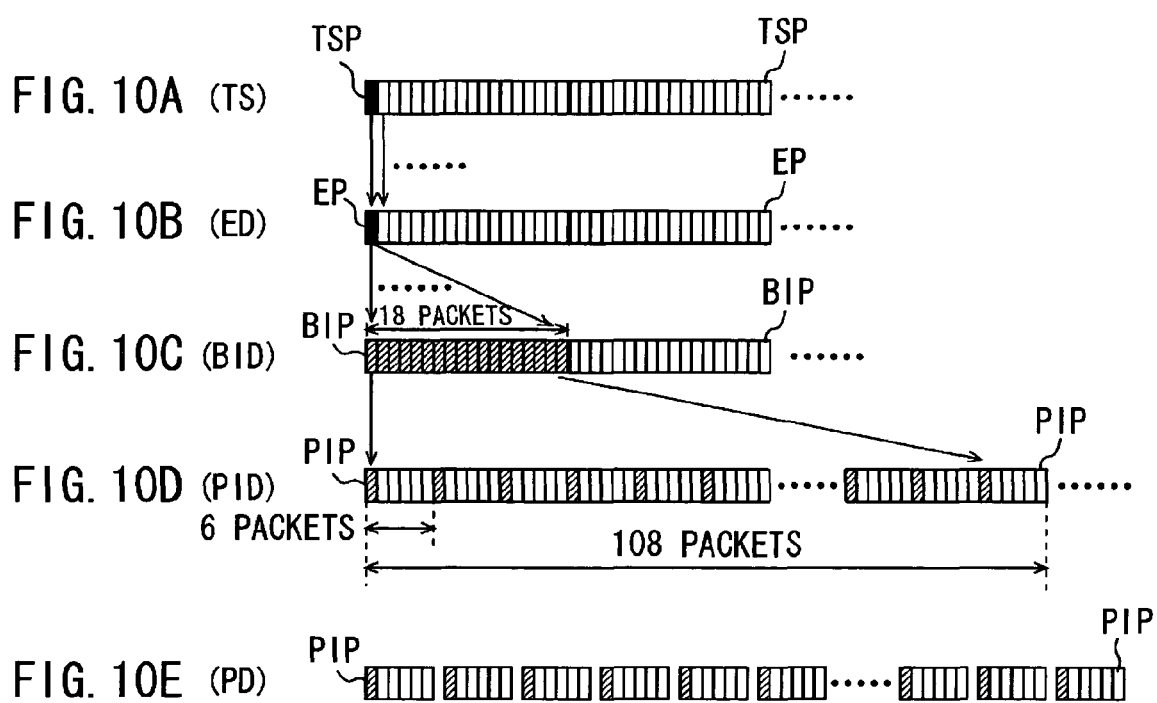

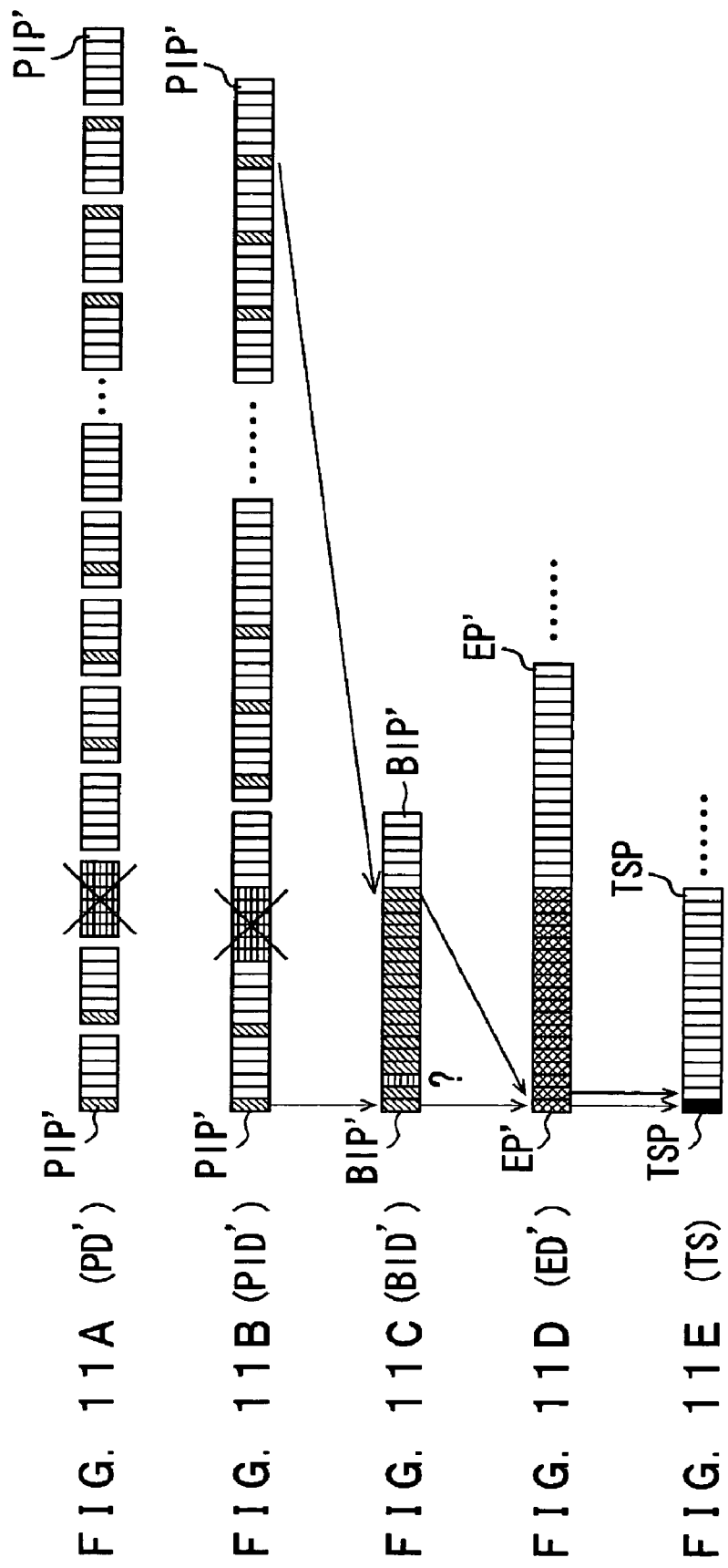

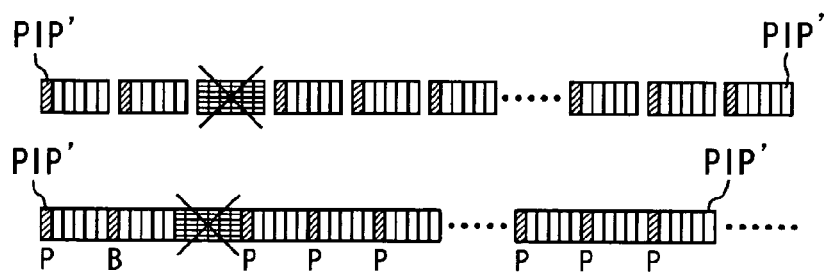
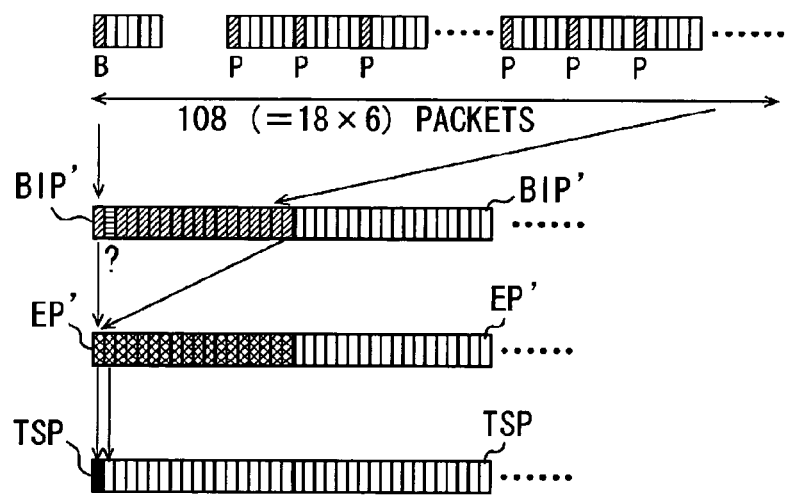
FIG. 12A (PD')
FIG. 12B (PID')
FIG. 12C (PID')
FIG. 12D (BID')
FIG. 12E (ED')
FIG. 12F (TS)

FIG. 14A
FIG. 14B
FIG. 14C
FIG. 14D

FIG. 15

| ADDRESS | PACKET No. | NUMBER OF DELAY PACKETS | BYTE No. | |
|---|---|---|---|---|
| 0 | 0 | 3 | 3 | ↑ |
|  | 0 | 3 | 7 | 1-BLOCK REGION |
|  | 0 | 3 | 11 | ↓ |
| 3 | 1 | 3 | 3 | |
|  | 1 | 3 | 7 | |
|  | 1 | 3 | 11 | |
| 6 | 2 | 3 | 3 | |
|  | 2 | 3 | 7 | |
|  | 2 | 3 | 11 | |
| 9 | 3 | 3 | 3 | |
|  | 3 | 3 | 7 | |
|  | 3 | 3 | 11 | |
| 12 | 2 | 1 | 1 | |
|  | 2 | 1 | 5 | |
|  | 2 | 1 | 9 | |
| 15 | 3 | 1 | 1 | |
|  | 3 | 1 | 5 | |
|  | 3 | 1 | 9 | |
| 18 | 1 | 2 | 2 | |
|  | 1 | 2 | 6 | |
|  | 1 | 2 | 10 | |
| 21 | 2 | 2 | 2 | |
|  | 2 | 2 | 6 | |
|  | 2 | 2 | 10 | |
| 24 | 3 | 2 | 2 | |
|  | 3 | 2 | 6 | |
|  | 3 | 2 | 10 | |
| 27 | | | | |

FIG. 16A PACKET No.: 0 ... 1 ... 3

FIG. 16B BYTE No.: 0 1 2 3 4 5 6 7 8 9 10 11 0 1 2 3 4 5 6 7 8 9 10 11 ... 0 1 2 3 4 5 6 7 8 9 10 11

FIG. 16C cnt_del: 3 2 1 0 3 2 1 0 3 2 1 0 ... 3 2 1 0 3 2 1 0 3 2 1 0

FIG. 16D cnt_block: 0 1 2 0 1 2 ... 0 1 2

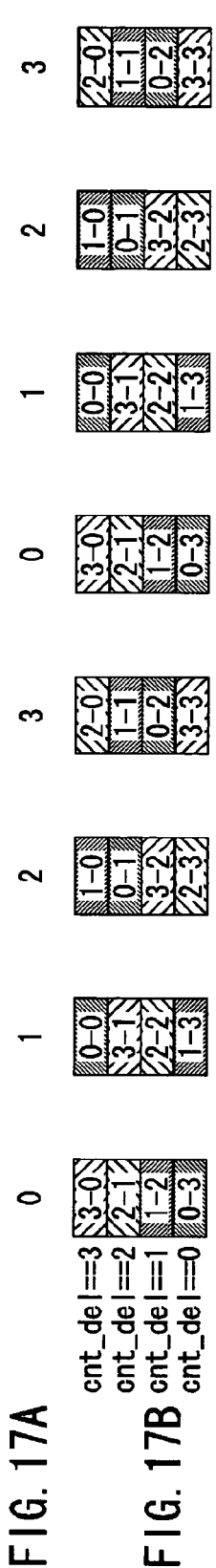
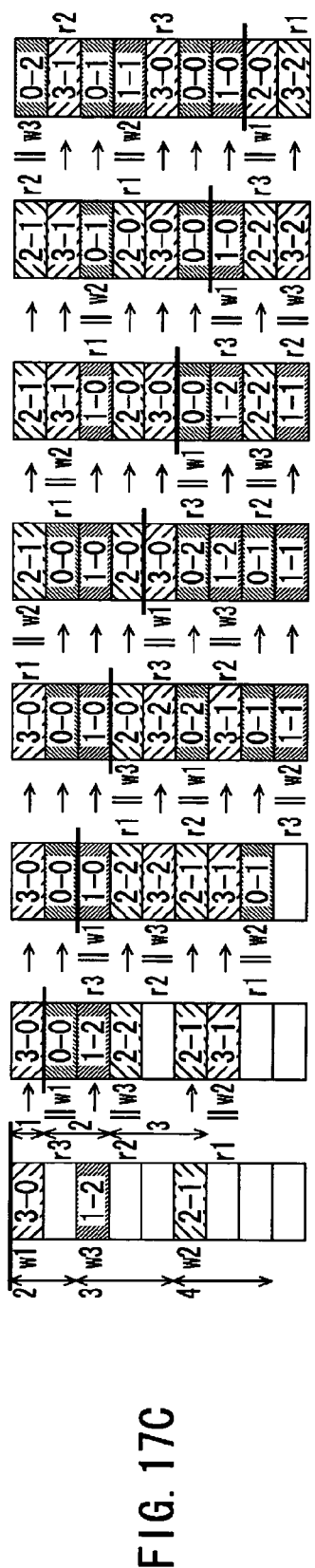
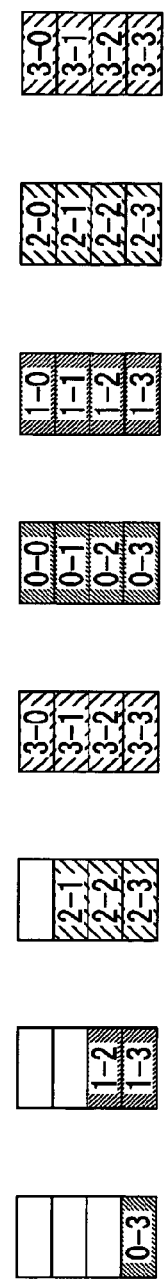
FIG. 17A
FIG. 17B
FIG. 17C
FIG. 17D

FIG. 18

| ADDRESS | PACKET No. | NUMBER OF DELAY PACKETS | BYTE No. | |
|---|---|---|---|---|
| 0 | 3<br>3<br>3 | 3<br>3<br>3 | 0<br>4<br>8 | ↕ 1-BLOCK REGION |
| 3 | 0<br>0<br>0 | 3<br>3<br>3 | 0<br>4<br>8 | |
| 6 | 1<br>1<br>1 | 3<br>3<br>3 | 0<br>4<br>8 | |
| 9 | 2<br>2<br>2 | 3<br>3<br>3 | 0<br>4<br>8 | |
| 12 | 3<br>3<br>3 | 1<br>1<br>1 | 2<br>6<br>10 | |
| 15 | 0<br>0<br>0 | 1<br>1<br>1 | 2<br>6<br>10 | |
| 18 | 3<br>3<br>3 | 2<br>2<br>2 | 1<br>5<br>9 | |
| 21 | 0<br>0<br>0 | 2<br>2<br>2 | 1<br>5<br>9 | |
| 24 | 1<br>1<br>1 | 2<br>2<br>2 | 1<br>5<br>9 | |
| 27 | | | | |

FIG. 19A
PACKET No.:

| 0 | ... | 1 | ... | 3 |

FIG. 19B
BYTE No.:

| 0 1 2 3 4 5 6 7 8 9 10 11 12 13 14 15 16 17 18 19 20 21 22 23 | ... | 0 1 2 3 4 5 6 7 8 9 10 11 12 13 14 15 16 17 18 19 20 21 22 23 | ... | 0 1 2 3 4 5 6 7 8 9 10 11 12 13 14 15 16 17 18 19 20 21 22 23 |

FIG. 19C
cnt_byte

| 0 1 0 1 0 1 0 1 0 1 0 1 0 1 0 1 0 1 0 1 0 1 0 1 | ... | 0 1 0 1 0 1 0 1 0 1 0 1 0 1 0 1 0 1 0 1 0 1 0 1 | ... | 0 1 0 1 0 1 0 1 0 1 0 1 0 1 0 1 0 1 0 1 0 1 0 1 |

FIG. 19D
cnt_del

| 0 1 2 3 0 1 2 3 0 1 2 3 0 1 2 3 0 1 2 3 0 1 2 3 | ... | 0 1 2 3 0 1 2 3 0 1 2 3 0 1 2 3 0 1 2 3 0 1 2 3 | ... | 0 1 2 3 0 1 2 3 0 1 2 3 0 1 2 3 0 1 2 3 0 1 2 3 |

FIG. 19E
cnt_block

| 0 | 1 | 2 | ... | 0 | 1 | 2 | ... | 0 | 1 | 2 |

FIG. 20

| ADDRESS | PACKET No. | NUMBER OF DELAY PACKETS | BYTE No. | | |
|---|---|---|---|---|---|
| 0 | 0 | 3 | 6 | } 1 UNIT | ↑ |
|  | 0 | 3 | 7 | | 1-BLOCK |
|  | 0 | 3 | 14 | } 1 UNIT | REGION |
|  | 0 | 3 | 15 | | |
|  | 0 | 3 | 22 | } 1 UNIT | |
|  | 0 | 3 | 23 | | ↓ |
| 6 | 1 | 3 | 6 | | |
|  | 1 | 3 | 7 | | |
|  | 1 | 3 | 14 | | |
|  | 1 | 3 | 15 | | |
|  | 1 | 3 | 22 | | |
|  | 1 | 3 | 23 | | |
| 12 | 2 | 3 | 6 | | |
|  | 2 | 3 | 7 | | |
|  | 2 | 3 | 14 | | |
|  | 2 | 3 | 15 | | |
|  | 2 | 3 | 22 | | |
|  | 2 | 3 | 23 | | |
| 18 | 3 | 3 | 6 | | |
|  | 3 | 3 | 7 | | |
|  | 3 | 3 | 14 | | |
|  | 3 | 3 | 15 | | |
|  | 3 | 3 | 22 | | |
|  | 3 | 3 | 23 | | |
| 24 | 2 | 1 | 2 | | |
|  | 2 | 1 | 3 | | |
|  | 2 | 1 | 10 | | |
|  | 2 | 1 | 11 | | |
|  | 2 | 1 | 18 | | |
|  | 2 | 1 | 19 | | |
| 30 | 3 | 1 | 2 | | |
|  | 3 | 1 | 3 | | |
|  | 3 | 1 | 10 | | |
|  | 3 | 1 | 11 | | |
|  | 3 | 1 | 18 | | |
|  | 3 | 1 | 19 | | |
| 36 | 1 | 2 | 4 | | |
|  | 1 | 2 | 5 | | |
|  | 1 | 2 | 12 | | |
|  | 1 | 2 | 13 | | |
|  | 1 | 2 | 20 | | |
|  | 1 | 2 | 21 | | |
| 42 | 2 | 2 | 4 | | |
|  | 2 | 2 | 5 | | |
|  | 2 | 2 | 12 | | |
|  | 2 | 2 | 13 | | |
|  | 2 | 2 | 20 | | |
|  | 2 | 2 | 21 | | |
| 48 | 3 | 2 | 4 | | |
|  | 3 | 2 | 5 | | |
|  | 3 | 2 | 12 | | |
|  | 3 | 2 | 13 | | |
|  | 3 | 2 | 20 | | |
|  | 3 | 2 | 21 | | |
| 54 | | | | | |

FIG. 21A
PACKET No.: 0 ... 1 ... 3

FIG. 21B
BYTE No.: 0 1 2 3 4 5 6 7 8 9 10 11 12 13 14 15 16 17 18 19 20 21 22 23 ... 0 1 2 3 4 5 6 7 8 9 10 11 12 13 14 15 16 17 18 19 20 21 22 23 ... 0 1 2 3 4 5 6 7 8 9 10 11 12 13 14 15 16 17 18 19 20 21 22 23

FIG. 21C
cnt_byte: 0 1 0 1 0 1 0 1 0 1 0 1 0 1 0 1 0 1 0 1 0 1 0 1 ... 0 1 0 1 0 1 0 1 0 1 0 1 0 1 0 1 0 1 0 1 0 1 0 1 ... 0 1 0 1 0 1 0 1 0 1 0 1 0 1 0 1 0 1 0 1 0 1 0 1

FIG. 21D
cnt_del: 3 2 1 0 3 2 1 0 3 2 1 0 ... 3 2 1 0 3 2 1 0 3 2 1 0 ... 3 2 1 0 3 2 1 0 3 2 1 0

FIG. 21E
cnt_block: 0 1 2 ... 0 1 2 ... 0 1 2

FIG. 22

| ADDRESS | PACKET No. | NUMBER OF DELAY PACKETS | BYTE No. | |
|---|---|---|---|---|
| 0 | 3<br>3<br>3<br>3<br>3<br>3 | 3<br>3<br>3<br>3<br>3<br>3 | 0<br>1<br>8<br>9<br>16<br>17 | } 1 UNIT<br>} 1 UNIT<br>} 1 UNIT  1-BLOCK REGION |
| 6 | 0<br>0<br>0<br>0<br>0<br>0 | 3<br>3<br>3<br>3<br>3<br>3 | 0<br>1<br>8<br>9<br>16<br>17 | |
| 12 | 1<br>1<br>1<br>1<br>1<br>1 | 3<br>3<br>3<br>3<br>3<br>3 | 0<br>1<br>8<br>9<br>16<br>17 | |
| 18 | 2<br>2<br>2<br>2<br>2<br>2 | 3<br>3<br>3<br>3<br>3<br>3 | 0<br>1<br>8<br>9<br>16<br>17 | |
| 24 | 3<br>3<br>3<br>3<br>3<br>3 | 1<br>1<br>1<br>1<br>1<br>1 | 4<br>5<br>12<br>13<br>20<br>21 | |
| 30 | 0<br>0<br>0<br>0<br>0<br>0 | 1<br>1<br>1<br>1<br>1<br>1 | 4<br>5<br>12<br>13<br>20<br>21 | |
| 36 | 3<br>3<br>3<br>3<br>3<br>3 | 2<br>2<br>2<br>2<br>2<br>2 | 2<br>3<br>10<br>11<br>18<br>19 | |
| 42 | 0<br>0<br>0<br>0<br>0<br>0 | 2<br>2<br>2<br>2<br>2<br>2 | 2<br>3<br>10<br>11<br>18<br>19 | |
| 48 | 1<br>1<br>1<br>1<br>1<br>1 | 2<br>2<br>2<br>2<br>2<br>2 | 2<br>3<br>10<br>11<br>18<br>19 | |
| 54 | | | | |

INTERLEAVE DEVICE, INTERLEAVING METHOD, DEINTERLEAVE DEVICE, AND DEINTERLEAVE METHOD

TECHNICAL FIELD

The present invention relates to an interleaving device, an interleaving method, a de-interleaving device and a de-interleaving method.

BACKGROUND ART

Recently, technologies have been developed for handling a video signal and/or an audio signal of a so-called high definition television (HDTV) such as a broadcast system formed by use of, for example, a broadcasting or business use video camera. In such a system, an apparatus referred to as a transcoder, which combines a function to compress and encode non-compressed video and/or audio signals by using an image-compressing system such as moving picture experts group (MPEG)-2 etc. and a function to decompress and decode these compressed and encoded video and/or audio signals, is used. That is, this transcoder performs compression and encoding on the basis of such an image compression system as MPEG-2 by use of a mounted encoder on non-compressed video and/or audio signals input through a serial bus etc. which conforms to, for example, the high definition-serial digital interface (HD-SDI) standards and transmits them as a transport stream comprised of plural transport packets (TS packets). Further, the transcoder can decompress and decode, by using a mounted decoder, a transport stream received through a predetermined communication path, to reproduce non-compressed video and/or audio signals.

As in the case of a transport stream transmitted and received by such a transcoder, in packet transmission in which predetermined data is transmitted and received with it being stored in a packet, a header is added to each of the packets, so that an overhead can be made less as larger size data is transferred with it being stored in one packet, thus effectively improving in view of a communication efficiency.

Further, in packet transmission, data is transferred in accordance with the Internet protocol (IP) often, so that packets are transmitted and received in accordance with a variety of transfer protocols that match a data format etc. Generally, packet communication based on the IP, as in the case of the file transfer protocol (FTP), for example, often conforms to a transfer protocol capable of re-transmitting a packet in accordance with a condition of the communication path. However, the packet transmission has recently applied to a case of an application for real-time communication in which re-transmission of packet is not permitted, for example, a real-time transport protocol (RTP) known as a transfer protocol for reproducing video and/or audio signals by streaming. In this case, a transmission side, which transmits a packet, needs to have a powerful error correcting capability so that a reception side can correct a significant burst error involving a packet loss by which a packet is lost due to an effect such as noise occurring on the communication path.

As such error-correcting technologies, it may be considered to add a predetermined error correction code such as a so-called Reed-Solomon code to a packet.

The following will describe an example using a Reed-Solomon code as the error correction code. By a Reed-Solomon code, if a 28-byte error correction code is added to a packet comprised of, for example, 188 bytes, error can be corrected completely when the number of bytes containing an error in each packet is 14 or less. That is, a Reed-Solomon code typically refers to an error correction code that can accommodate only a random error. However, a Reed-Solomon code is not capable of correcting errors if the number of bytes containing an error in each packet is in excess of 14 bytes. Therefore, a Reed-Solomon code has no effect on a significant burst error that contains a packet loss.

To cope with it, as the error-correcting technologies, typically, a predetermined error correction code such as a Reed-Solomon code is added to a packet and then folding interleaving is performed on it, to disperse errors.

That is, in the packet communication, even if a burst error, which has occurred on a communication path, is superimposed on packets on which a transmission side has performed the folding interleaving, a reception side can perform the corresponding folding de-interleaving on them to handle each of them as a random error for each packet and decode an error correction code such as a Reed-Solomon code, thereby correcting even the burst error. For example, in the packet communication, if folding interleaving with a depth of 18 is performed on packets each comprised of 216 bytes which is obtained by adding a 28-byte error correction code to the above-mentioned 188-byte packet, even when one of the consecutive 18 packets has erred completely, the reception side may correct the error completely. Therefore, in the packet communication, especially when data is transmitted or received through a communication path subject to a packet loss, consecutive pieces of information of one packet may be all lost; in such a case, by using such an error-correcting technology, the lost packet can be restored completely.

In such a manner, in the packet communication, in a case where it is applied to an application for real-time communication in which re-transmission of packets is not permitted, the error correcting capability for a burst error containing a packet loss can be improved by adding a predetermined error correction code to a packet and performing folding interleaving on a packet thus obtained.

In the packet communication, again, to correct a significant burst error containing a packet loss by using an error-correcting technology that combines the above-mentioned error correction code and folding interleaving, it is necessary to use an error correction code having a very large code length that matches a packet size.

However, in the packet communication, if an error correction code having a large code length is added, a data overhead increases, thereby deteriorating communication efficiency. Further, in the packet communication, addition of such an error correction code with a large code length brings about not only deterioration in communication efficiency but also an increase in scale of circuits of an encoder and a decoder for an error correction code.

Therefore, in the packet communication, it is desirable to reduce the code length of an error correction code as much as possible.

On the other hand, in the packet communication, if the error correction code length is reduced, a depth of folding interleaving must be increased largely to correct a significant burst error containing a packet loss.

In terms of mounting of folding interleaving device, a depth of relevant folding interleaving and a required memory capacity are proportional to each other. Therefore, in the packet communication, to increase the depth of folding interleaving, the required memory capacity increases, which is not desirable.

Further, in the folding interleaving, as the memory, it is necessary to use such a storage device as to be capable of accessing inconsecutive addresses for each clock of about one clock synchronized with each data word in units of a byte in the case of, for example, the MPEG standard, that is, a dual-port random access memory (hereinafter abbreviated as DPRAM), which is capable of being random accessed.

In this case, as the folding interleaving, a dedicated integrated circuit can be mounted; but, as viewed from a point of costs, handling ease, etc., effectively a general-purpose programmable device such as a so-called programmable logic device (PLD) or field programmable gate array (FPGA) may be mounted. However, in the folding interleaving, since a DPRAM provided in such a general-purpose programmable device has a small capacity, it is difficult to obtain a sufficient depth necessary to correct a significant burst error containing a packet loss by compensating for a decrease in code length of an error correction code. Further, in the folding interleaving, if a problem is a memory capacity only, the problem can be solved by using a general-purpose memory to be externally mounted to a programmable logic device such as a synchronous dynamic random access memory (SDRAM); however, such an externally mounted device is surely effective in burst transfer of data in units of plural data words but needs a period for inputting a command signal for access, so that time-wise consecutive random access of addresses in units of a data word is difficult because it increases an overhead and decreases a throughput and, to realize such access, very complicated circuits must be provided in a periphery of the memory, so that it is difficult to mount them for the purpose of high-speed access in units of a data word.

As described above, in the packet communication, to correct a significant burst error containing a packet loss by using an error-correcting technology that combines an error correction code and folding interleaving, the error correction code must have a large code length, thus resulting a problem such as a deterioration in communication efficiency and an increase in circuit scale; if instead of using an error correction code having a small code length, folding interleaving with a large depth is realized, a program such as an increase in memory capacity occurs.

DISCLOSURE OF THE INVENTION

In view of the above, the present invention has been developed, and it is an object of the present invention to provide an interleaving device and an interleaving method that can realize interleaving, which enables correcting a significant burst error containing a packet loss by using an error correction code having a small code length on a transmission side for performing packet communication, and a de-interleaving device and a de-interleaving method that can restore on a reception side an array of data on which interleaving has been performed using the interleaving device and method.

The object of the present invention is attained by providing an interleaving device for outputting items of input data after rearranging them in terms of order according to a predetermined address, the device comprising: first interleaving means for performing folding interleaving on first data comprised of plural input packets, in units of a data word or plural consecutive data words; and second interleaving means for performing interleaving on second data comprised of plural packets generated by the first interleaving means, in units of a packet.

It is also attained by providing an interleaving method for outputting items of input data after rearranging them in terms of order according to a predetermined address, the method comprising: a first interleaving step of performing folding interleaving on first data comprised of plural input packets, in units of a data word or plural consecutive data words; and a second interleaving step of performing interleaving, in units of a packet, on second data comprised of plural packets generated by the first interleaving step.

It is further attained by providing a de-interleaving device for outputting items of input data after rearranging them in terms of order according to a predetermined address in such a manner as to restore to an original data array a data array rearranged by using an interleaving device comprising first interleaving means for performing folding interleaving on first data comprised of plural input packets, in units of a data word or plural consecutive data words and second interleaving means for performing interleaving on second data comprised of plural packets generated by the first interleaving means, in units of a packet, the de-interleaving device comprising first de-interleaving means for performing de-interleaving, in units of a packet, on third data comprised of plural input packets, in such a manner as to restore an order of packets of data on which interleaving is performed by the second interleaving means to an order of the packets of the second data and second de-interleaving means for performing folding de-interleaving, in units of a data word or plural consecutive data words, on fourth data comprised of plural packets generated by the first de-interleaving means, in such a manner as to restore an order of the packets of the second data on which interleaving is performed by the first interleaving device to an order of the packets of the first data.

It is additionally attained by providing a de-interleaving method for outputting items of input data after rearranging them in terms of order according to a predetermined address in such a manner as to restore to an original data array a data array rearranged by using an interleaving method comprising a first interleaving step of performing folding interleaving on first data comprised of plural of input packets, in units of a data word or plural of consecutive data words and a second interleaving step of performing interleaving, in units of a packet, on second data comprised of plural packets generated by the first interleaving step, the de-interleaving method comprising a first de-interleaving step of performing de-interleaving, in units of a packet, on third data comprised of plural input packets, in such a manner as to restore an order of packets of data on which interleaving is performed in the second interleaving step to an order of the packets of the second data and a second de-interleaving step of performing folding de-interleaving, in units of a data word or plural consecutive data words, on fourth data comprised of plural packets generated in the first de-interleaving step, in such a manner as to restore an order of the packets of the second data on which interleaving is performed in the first interleaving step to an order of the packets of the first data.

BRIEF DESCRIPTION OF THE DRAWINGS

FIG. 1 shows a block diagram for showing a configuration of a data transmission/reception system;

FIGS. 3A and 3B are diagrams each for explaining interleaving processing performed in units of a byte by a byte interleaver of the encoder;

FIGS. 4A and 4B are diagrams each for explaining interleaving processing performed in units of plural consecutive bytes by the byte interleaver of the encoder;

FIGS. 5A and 5B are diagrams each for explaining folding interleaving processing performed in units of a packet by a packet interleaver of the encoder;

FIGS. 6A and 6B are diagrams each for explaining block interleaving processing performed in units of a packet by the packet interleaver of the encoder;

FIGS. 7A-7D are diagrams each for specifically explaining transition of data contents in portions in the encoder in a case where folding interleaving processing is performed in units of a packet by the packet interleaver;

FIGS. 8A-8E are diagrams each for specifically explaining transition of the data contents in the portions in the encoder in a case where block interleaving processing is performed in units of a packet by the packet interleaver;

FIGS. 9A-9F are diagrams each for explaining transition of a packet format in the portions in the encoder in a case where folding interleaving processing is performed in units of a packet by the packet interleaver;

FIGS. 10A-10E are diagrams each for explaining transition of the packet format in the portions in the encoder in a case where block interleaving processing is performed in units of a packet by the packet interleaver;

FIGS. 11A-11E are diagrams each for explaining transition of the packet format in the portions in a decoder in a case where folding interleaving processing is performed in units of a packet by the packet interleaver;

FIGS. 12A-12F are diagrams each for explaining transition of the packet format in the portions in the decoder in a case where block interleaving processing is performed in units of a packet by the packet interleaver;

FIGS. 13A-13D are diagrams each for explaining a count value when processing is performed in units of a byte by the byte interleaver;

FIGS. 14A-14D are diagrams each for explaining data write and read operations performed to a DPRAM in the processing by the byte interleaver;

FIG. 15 is a diagram for showing ones example of a data mapping condition in the DPRAM provided in the byte interleaver;

FIGS. 16A-16D are diagrams each for explaining a count value when processing is performed in units of a byte by a byte de-interleaver;

FIGS. 17A-17D are diagrams each for explaining data write and read operations performed to the DPRAM in the processing by the byte de-interleaver;

FIG. 18 is a diagram for showing one example of a data mapping condition in the DPRAM provided in the byte de-interleaver;

FIGS. 19A-19E are diagrams each for explaining a count value when processing is performed by the byte interleaver in units of plural consecutive bytes;

FIG. 20 is a diagram for showing a condition where data is mapped to addresses in the DPRAM provided to the byte interleaver;

FIGS. 21A-21E are diagrams each for explaining a count value when processing is performed by the byte de-interleaver in units of plural consecutive bytes;

FIG. 22 is a diagram for showing a condition where data is mapped to addresses in the DPRAM provided to the byte de-interleaver;

BEST MADE FOR CARRYING OUT THE INVENTION

Figure 2A:
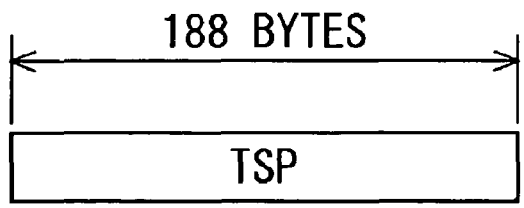
FIGS. 2A and 2B are diagrams each for explaining processing by a Reed-Solomon-encoding portion in an encoder of the data transmission/reception system.

The following will describe in more detail the present invention with reference to appended drawings.

In this best mode, a data transmission/reception system comprises an encoder for receiving packeted data, adding a predetermined error correction code to each of the packets, performing interleaving on them, and outputting them, and a decoder for decoding incoming data received from this encoder through a predetermined communication path. In this data transmission/reception system, the encoder performs, as the interleaving, folding interleaving in units of a data word or plural consecutive data words and interleaving in units of a packet, to enable a significant burst error containing a packet loss to be corrected using an error correction code having a small code length. In the data transmission/reception system, the decoder, on the other hand, decodes incoming data transmitted as encoded by such an encoder and received via a predetermined communication path, thus completely correcting a significant burst error containing a packet loss.

Especially, in the data transmission/reception system, in realization of folding interleaving and folding de-interleaving, in units of a data word or plural consecutive data words, in contrast to a typical case where such a memory is mounted as to have a capacity for data words as many as a number equal to a product of a depth of the folding interleaving plus that of the folding de-interleaving and the number of data words per packet, the present invention can realize the similar folding interleaving and folding de-interleaving by using a memory having a much smaller capacity than that.

The following description is made on the assumption that in the data transmission/reception system, the encoder receives plural transport packets (TS packets) that constitutes a transport stream obtained by performing compression and encoding on the basis of the so-called MEPG-2 standard on non-compressed video and/or audio signals input through a serial bus etc. which conforms to, for example, the high definition-serial digital interface (HD-SDI) standards, and as an error correction code to be added by this encoder to the transport packet, a so-called Reed-Solomon code is used.

As shown in FIG. 1, for example, a data transmission/ reception system comprises an encoder 10 for receiving a transport stream TS comprised of plural transport packets TSP and encoding it, and a decoder 20 for decoding receive data RD received from this encoder 10 through a predetermined communication path and restoring the transport stream TS.

First, the encoder 10 is described. As shown in FIG. 1, for example, the encoder 10 has: a Reed-Solomon-encoding portion 11 for performing Reed-Solomon encoding on each of the transport packets TSP which constitute the transport stream TS; a byte interleaver 12 for performing folding interleaving, in units of a byte or plural consecutive bytes, on encoded data ED comprised of plural encoded packets EP to each of which an error correction code is added by this Reed-Solomon encoder 11; a packet interleaver 13 for performing interleaving, in units of a packet, on byte interleave data BID comprised of plural byte interleave packets BIP on which this byte interleaver 12 performs folding interleaving; a packeting portion 14 for generating one item of packet data PD by linking to each other predetermined numbers of packet-unit interleave packets PIP of packet interleave data PID comprised of the plural packet-unit interleave packets PIP on which the packet interleaver 13 performs interleaving in units of a packet; and a transmission portion 15 for adding a predetermined header to each packet data PD generated by the packeting portion 14 and transmitting it as transmit data TD comprised of plural upper-layer packets.

In the encoder 10, of these portions, at least the Reed-Solomon-encoding portion 11, the byte interleaver 12, an interface portion 17 in the packet interleaver 13, and the packeting portion 14, which are enclosed by a broken line in FIG. 1, are mounted in a form of a programmable device such as a programmable logic device (PLD) or a field programmable gate array (FPGA).

Figure 2B:
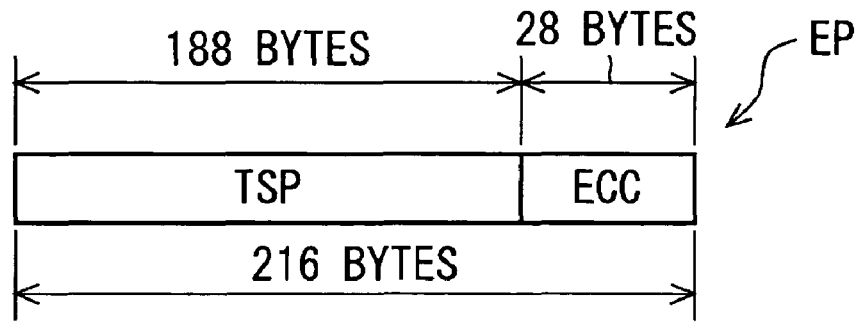

The Reed-Solomon-encoding portion 11 performs Reed-Solomon encoding on each of the transport packets TSP which constitute a transport stream TS input as an information sequence, to generate encoded data ED comprised of plural encoded packets EP. Specifically, Reed-Solomon-encoding portion 11 adds an error correction code (ECC) comprised of 28 bytes as a parity, as shown in FIG. 2B, to each of the transport packets TSP of a transport stream TS, each of which is comprised of 188 bytes as shown in FIG. 2A, to generate encoded data ED comprised of encoded packets EP each of which has a code length of 216 bytes per packet. Note here that beginning data of each of the encoded packets EP consists of a sink byte in a packet header of the transport packet TSP according to the MPEG-2 standard and has a value of "0x47". The Reed-Solomon-encoding portion 11 supplies the byte interleaver 12 on its downstream side with encoded data ED comprised of the generated plural encoded packets EP. Note here that an error correction capability, if this encoded data ED is output as it is, is enough to completely correct an error of up to 14 bytes for each encoded packet EP.

The byte interleaver 12 performs folding interleaving having predetermined depth and period on each of the encoded packets EP of the encoded data ED supplied from the Reed-Solomon-encoding portion 11, in units of a data word or plural consecutive data words, that is, in units of a byte or plural consecutive bytes because the MPEG standard is employed, to rearrange the bytes of each of the encoded packets EP in terms of order, thereby generating a byte interleave data BID comprised of plural byte interleave packets BIP. Specifically, although not shown, the byte interleaver 12 is comprised of a dual-port random access memory (hereinafter abbreviated as DPRAM) capable of accessing inconsecutive addresses for each clock synchronized with a byte for each of the bytes, an address generation portion for performing data write and read operations to this DPRAM, etc. The byte interleaver 12 sequentially transfers items of input encoded data ED to the DPRAM in accordance with a predetermined write address and writes them to it, and sequentially reads the data thus written to this DPRAM in accordance with a predetermined read address that is different from the write address, thereby performing, for example, folding interleaving with a depth of 18 and a period of 12 in units of a byte or folding interleaving with a depth of 18 and a period of 3 in units of consecutive four bytes as one processing unit on the encoded data ED generated by the Reed-Solomon-encoding portion 11.

Note here that a depth of folding interleaving indicates such a numerical value that in a case where interleaving is performed in units of a byte, packets as many as a first number of bytes are divided into groups as many as a second number of bytes which is smaller than the first number of bytes, to disperse each of the bytes 1 of a divided unit comprised of this second number of bytes into mutually different divided units; and a period indicates a separation quantity for divided unit, by which the adjacent bytes are dispersed and is represented as a quotient obtained by dividing the first number of bytes by a depth of folding interleaving. Further, a depth of folding interleaving indicates such a numerical value that that in a case where interleaving is performed in units of plural consecutive bytes, packets as many as a first number of bytes are divided into groups as many as a second number of bytes, which is smaller than the first number of bytes, to disperse it to mutually different divided units in units of plural consecutive bytes (hereinafter referred to as "unit") of divided units comprised of this second number of bytes; and a period indicates a separation quantity of divided unit, by which the adjacent units are dispersed and is represented as a quotient obtained by dividing a quotient obtained by dividing the first number of bytes by a depth of folding interleaving further by the unit.

That is, in a case where interleaving is performed in units of a byte, the byte interleaver 12, as shows in FIG. 3A, divides one encoded packet EP comprised of 216 bytes by 18 bytes into twelve divided units and, as shown in FIG. 3B, performs such folding interleaving with a depth of 18 and a period of 12 as to avoid rearranging the first byte of the first divided unit (at this moment, the first byte is placed to a position delayed by one byte), place the following second byte to a position delayed by (18×12×1−1) bytes, that is, rearrange it so that it may be positioned to the second byte of the second packet, and place the following third byte to a position delayed by (18×12×2−1) bytes, that is, rearrange it so that it may be positioned to the third byte of the third packet; thereby generating byte interleave data BID comprised of plural byte interleave packets BIP. Therefore, because of folding interleaving being performed by the byte interleaver 12, information contained in one encoded packet EP is dispersed by 12-byte into consecutive eighteen byte interleave packets BIP.

Further, in a case where interleaving is performed in units of a unit assuming the one unit is comprised of consecutive four bytes because the header of a transport stream TS is comprised of four bytes, the byte interleaver 12, as shows in FIG. 4A, divides one encoded packet EP comprised of 216 bytes by (4×18=72) bytes into three divided units and, as shown in FIG. 4B, performs such folding interleaving with a depth of 18 and a period of 3 as to avoid rearranging the first unit that constitutes the first divided unit (at this moment, the first byte of the one unit that constitutes the first divided unit is places to a position delayed by one byte), place the following second unit to a position delayed by (72×3×1−1) bytes, that is, rearrange it so that it may be positioned to the second unit of the second packet, and place the following third unit to a position delayed by (72×3×2−1) bytes, that is, rearrange it so that it may be positioned to the third unit of the third packet, thereby generating byte interleave data BID comprised of plural byte interleave packets BIP. Therefore, because of folding interleaving being performed by the byte interleaver 12, information contained in one encoded packet EP is dispersed by 12-byte into consecutive eighteen byte interleave packets BIP for each unit.

Although this does not cause the byte interleaver 12 to improve the error correction capability of the Reed-Solomon-encoding portion 11, the information can be dispersed in arrangement to transform a burst error containing a packet loss into a random error. Specifically, by an error correction capability in a case where byte interleave data BID is output as it is, even if one packet for each consecutive eighteen byte interleave packets BIP, that is, 216 bytes are completely erroneous, all the bits can be corrected. Note here that beginning data of each of the byte interleave packets BIP is the same as that of the encoded packet EP and constitutes a sink byte in the packet header of a transport packet TSP according to the MPEG-2 standard, having a value of "0x47". The byte interleaver 12 supplies its downstream-side packet interleaver 13 with byte interleave data BID comprised of plural byte interleave packets BIP thus generated.

Note here that this byte interleaver 12 can control addresses in accordance with a predetermined address generation system to reduce a capacity of a memory, that is, the DPRAM, necessary to perform folding interleaving in units of a byte or a unit, which will be described later.

The packet interleaver 13 performs interleaving with predetermined depth and period in units of a packet on each of the byte interleave packets BIP that constitute byte interleave data BID supplied from the byte interleaver 12 and rearranges the byte interleave packets BIP in terms of order, thereby generating packet interleave data PID comprised of plural packet-unit interleave packets PIP. Specifically, the packet interleaver 13 comprises a synchronous dynamic random access memory (SDRAM) 16 externally attached to each of the portions mounted in a form of a programmable device in order to burst-transfer data in units of plural bytes, and the interface portion 17 for performing processing such as address generation and data transmission/reception in order to perform data write and read operations to this SDRAM 16. The packet interleaver 13 sequentially transfers and writes items of the byte interleave data BID input to the interface portion 17, to the SDRAM 16 in accordance with a predetermined write address and sequentially reads the items of data written to this SDRAM 16 in accordance with a predetermined read address that is different from the write address, thereby performing folding interleaving with a depth of 6 and a period of 4 in units of byte interleave packets on byte interleave data BID supplied from the byte interleaver 12 or block interleaving with a depth of 6 that is completed with consecutive 108 packets of a byte interleave packet BIP.

That is, in a case where folding interleaving is performed, the packet interleaver 13, as shown in FIG. 5A, regards consecutive 24 byte interleave packets BIP as one packet (hereinafter referred to as temporary composite packet CPT) and, as shown in FIG. 5B, performs such folding interleaving as to avoid rearranging the first byte interleave packet BIP that constitutes a divided unit comprised of the first six byte interleave packets BIP in certain one temporary composite packet CPT, place the following second byte interleave packet BIP to a position delayed by (6×4×1−1) packets, that is, rearrange it so that it may be positioned to the second packet in the second temporary composite packet CPT, and place the following third byte interleave packet BIP to a position delayed by (6×4×2−1) packets, that is, rearrange it so that it may be positioned to the third packet in the third temporary composite packet CPT, thereby generating packet interleave data PID comprised of plural packet-unit interleave packets PIP. Therefore, because of folding interleaving being performed by the byte packet interleaver 13, information contained in one encoded packet EP is sporadically dispersed into consecutive 6×4(=24)×6=144 packet-unit interleave packets PIP in such a condition that the information is dispersed by 12 bytes with a spacing of at least six packet-unit interleave packets PIP therebetween. In this case, the SDRAM 16 that constitutes the packet interleaver 13 only needs to have a capacity to store at least 144 packet-unit interleave packets PIP.

Further, in a case where block interleaving is performed, the packet interleaver 13, as shown in FIG. 6A, regards consecutive 108 byte interleave packets BIP as one temporary composite packet CPT, divides this temporary composite packet CPT by 18 byte interleave packets into six groups, and, as shown in FIG. 6B, avoids rearranging the first byte interleave packet BIP of the byte interleave packets that constitute the first group and rearranges the following second through 18'th byte interleave packets BIP sequentially to positions each delayed by six byte interleave packets. The first byte interleave packet BIP in the byte interleave packets that constitute the second group is rearranged to a position next to the position of the first byte interleave packet BIP in the first group. Further, the second through 18th byte interleave packets BIP are rearranged sequentially to positions each delayed by six byte interleave packets. Similarly, such block interleaving is performed that the first byte interleave packet BIP of the byte interleave packets that constitute the sixth group may be rearranged to a position next to the position of the sixth byte interleave packet BIP in the first group and the second through 18'th byte interleave packets BIP may be rearranged sequentially to positions each delayed by six byte interleave packets, thereby generating packet interleave data PID comprised of plural packet-unit interleave packets PIP. Therefore, because of block interleaving being performed by the byte packet interleaver 13, information contained in one encoded packet EP is sporadically dispersed into consecutive 108 packet-unit interleave packets PIP on which block interleaving has been performed, and if the packet interleave data PID is divided into groups each having consecutive six packet-unit interleave packets, information is dispersed by 12 bytes into these groups in a one-to-one relationship. In this case, the SDRAM 16 that constitutes the packet interleaver 13 only needs to have a capacity to store at least 216 packet-unit interleave packets PIP.

Although, as in the case of the byte interleaver 12, this does not cause the packet interleaver 13 to improve the error correction capability of the Reed-Solomon-encoding portion 11, the information can be dispersed in arrangement more than that by the byte interleaver 12, to transform a larger burst error containing a packet loss into a random error. Specifically, by an error correction capability in a case where packet interleave data PID generated by folding interleaving is output as it is, even if up to consecutive six packet-unit interleave packets PIP of the consecutive 144 packet-unit interleave packets PIP, that is, 1296 bytes are completely erroneous, all the bits can be corrected. Further, by an error correction capability in a case where packet interleave data PID generated by block interleaving is output as it is, even if up to consecutive six packet-unit interleave packets PIP of the consecutive 108 packet-unit interleave packets PIP, that is, 1296 bytes are completely erroneous, all the bits can be corrected. Furthermore, in contrast to the case of employing folding interleaving where errors of up to six packet-unit interleave packets PIP of the consecutive 144 packet-unit interleave packets PIP can be corrected, in the case of employing block interleaving, errors of up to six packet-unit interleave packets PIP of the consecutive 108 packet-unit interleave packets PIP can be corrected, thus improving the error correction capability.

Note here that a beginning packet in packet interleave data PID on which interleaving is thus performed by the packet interleaver 13 cannot be known as it is by a reception side, so that synchronization is difficult to perform. Therefore, to notify the reception side of the beginning packet in the packet interleave data PID, the packet interleaver 13 exchanges a value of a sink byte which is beginning data of a first packet-unit interleave packet PIP. That is, when folding interleaving with a depth of 6 is performed by the packet interleaver 13, it inverts the beginning data of a packet-unit interleave packet PIP for each six packet to replace "0×47" with "0×B8", thereby generating packet interleave data PID to be output finally.

Further, when block interleaving is performed, to notify the reception side of a beginning packet in an interleave block comprised of, for example, consecutive 108 packet-unit interleave packets PIP, the value of a sink byte which is the beginning data of the first packet-unit interleave packet PIP in the interleave block is changed from "0×47" to, for example, "0×B7". Furthermore, for the remaining packet-unit interleave packets PIP, by inverting the value of the sink byte for each six packet-unit interleave packets PIP to replace "0×47"

with "0×B8", it is possible for the reception side to detect "0×B8" and thereby synchronize de-interleaving processing beforehand, thus rapidly obtaining an output after the block de-interleaving processing is performed when "0×B7" is detected.

The packet interleaver 13 supplies its down-stream side packeting portion 14 with the packet interleave data PID comprised of plural packet-unit interleave packets PIP thus generated.

The packeting portion 14 links to each other predetermined numbers of packet-unit interleave packets PIP that constitute the packet interleave data PID supplied from the packet interleaver 13 to generate one item of packet data PD. Specifically, to transfer a video signal and/or an audio signal in accordance with real-time transport protocol (RTP) known as a transfer protocol for streaming reproduction, the packeting portion 14 links one after another the consecutive six packet-unit interleave packets PIP of a sequence of packet-unit interleave packets PIP and store them as an upper layer in one packet of the RTP, thereby generating packet data PD. Further, if packet interleave data PID is generated after block interleaving is performed on it, an RTP packet is generated starting from a position that indicates the beginning of an interleave block, that is, a position where the sink byte has a value of "0×B7". By linking the six packet-unit interleave packets PIP one after another and storing them as the upper layer in one packet of the RTP, the packet data PD is generated. Note here that if the sink byte value is changed from "0×47" to "0×B8", these values "0×B7" and "0×B8" can be detected to thereby easily generate packet data PD obtained by linking the six packet-unit interleave packets PID one after another.

Figures 7A, 7B, 7C, 7D:
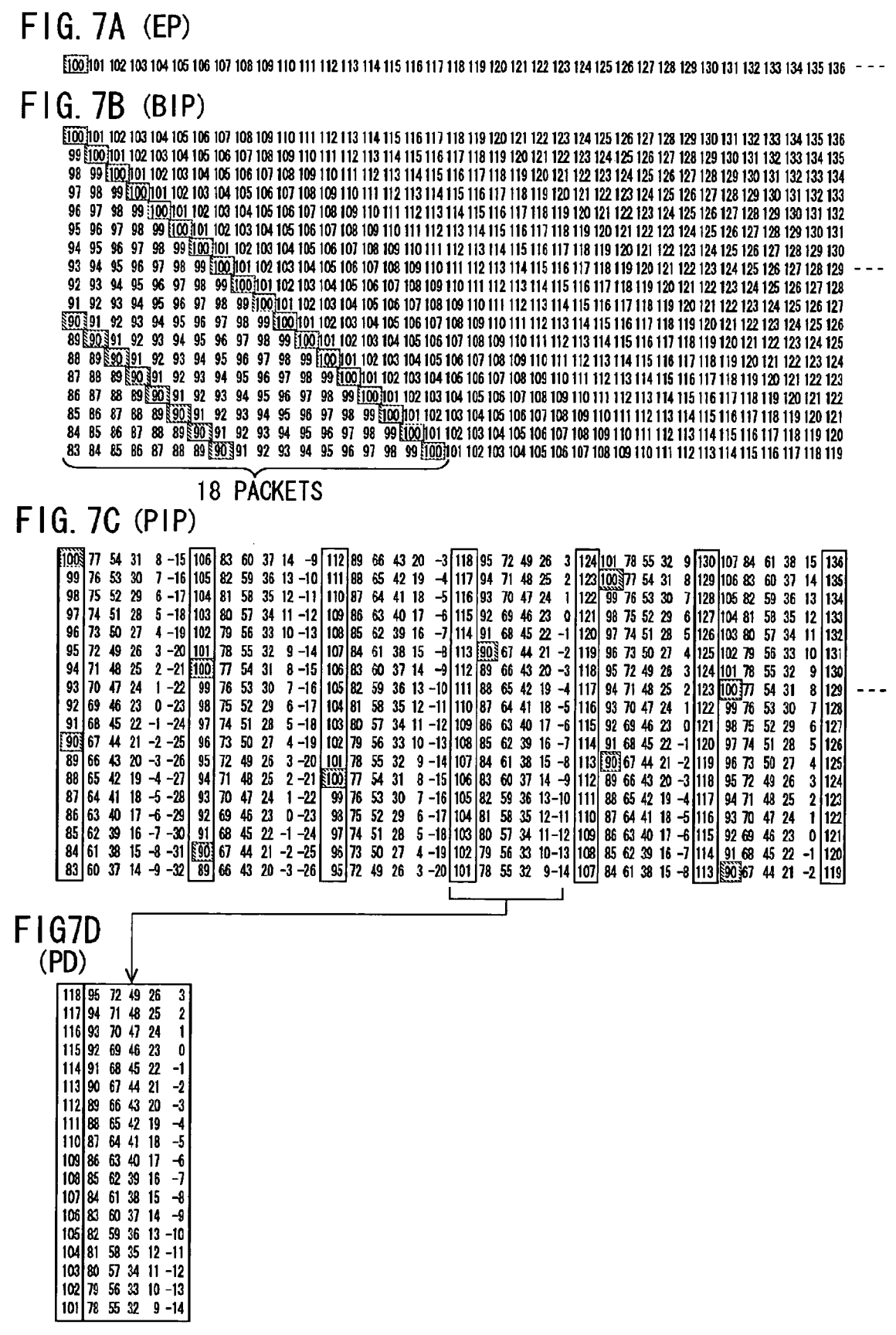

In this case, the six packet-unit interleave packets PIP linked one after another as this packet data PD contains each 12 bytes of information of 18×6=108 encoded packets EP. FIGS. 7A-7D explain transition of generation of packet data PD in a case where folding interleaving is performed in units of bytes (or units) by the byte interleaver 12. If orders of encoded packets EP are indicated as . . . , 100, 101, . . . , 136, . . . as shown in FIG. 7A, the encoder 10 disperses information contained in one of the encoded packet EP into consecutive 18 byte interleave packets BIP each having 12 bytes as shown in FIG. 7B. Furthermore, the encoder 10 aggregates one column of information in FIG. 7C to generate one packet-unit interleave packet PIP. Then, the encoder 10 uses the packeting portion 14 to link arbitrary consecutive six packet-unit interleave packets PIP one after another, thereby generating one item of packet data PD as shown in FIG. 7D. Therefore, each of the items of packet data PD contains each 12 bytes of information of 18×6=108 encoded packets EP as described above.

Figures 8A, 8B, 8C, 8D, 8E:
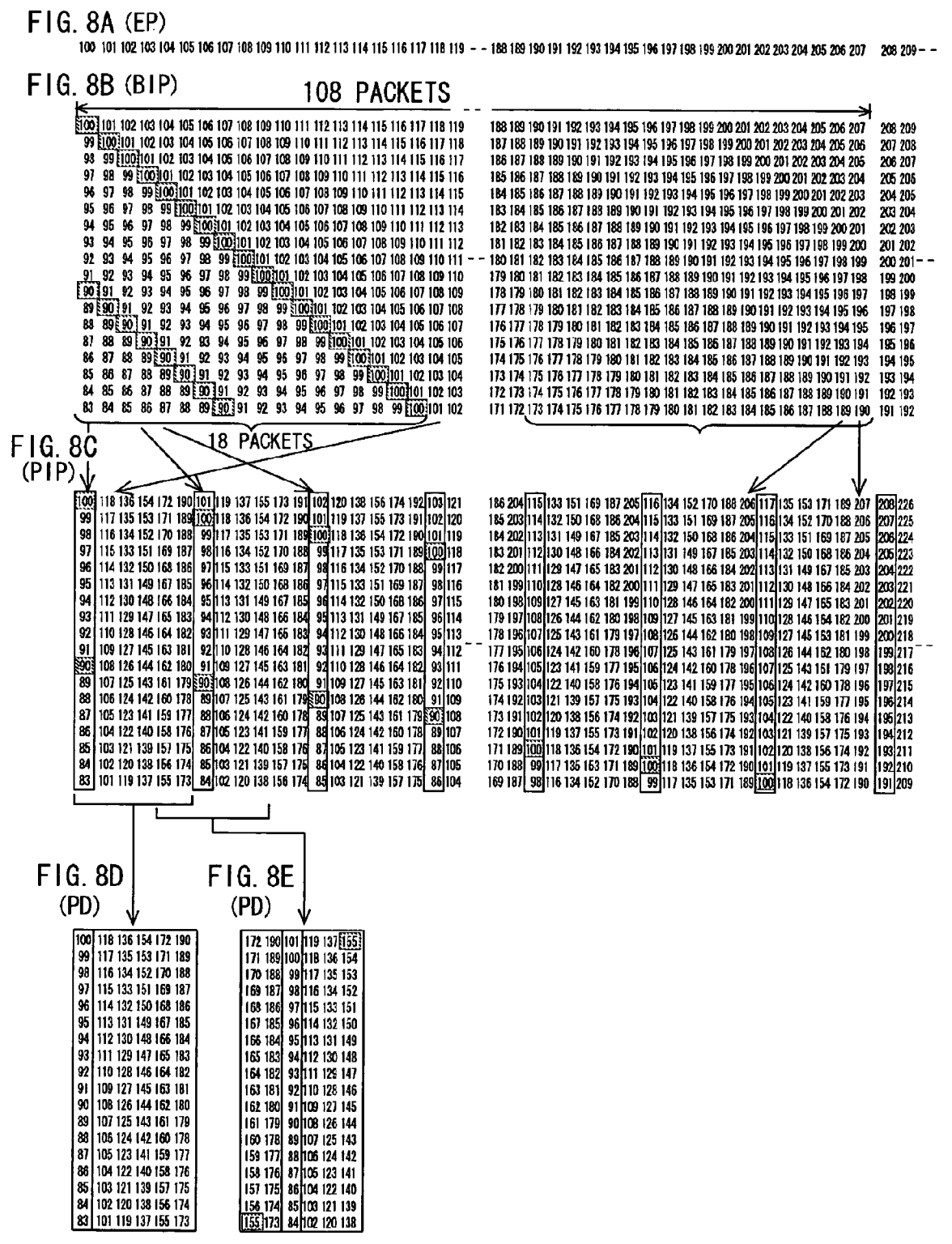

FIGS. 8A-8E explain transition of generation of packet data PD in a case where folding interleaving is performed in units of a unit (or byte) by the byte interleaver 12 and block interleaving is performed by the packet interleaver 13. If orders of encoded packets EP are indicated as . . . , 100, 101, . . . , 136, . . . as shown in FIG. 8A, the encoder 10 disperses information contained in one of the encoded packets EP by 12 bytes into consecutive 18 byte interleave packets BIP, as shown in FIG. 8B. Furthermore, the encoder 10 aggregates one column of information in FIG. 8C to generate one packet-unit interleave packet PIP. Then, the encoder 10 uses the packeting portion 14 to link one after another arbitrary consecutive six packet-unit interleave packets PIP starting from the beginning packet-unit interleave packet PIP in the interleave block, thereby generating one item of packet data PD as shown in FIG. 8D. Therefore, each of the items of packet data PD contains each 12 bytes of information of 18×6=108 encoded packets EP as described above.

Such packet data PD has no overlapping numbers as shown in FIGS. 7D and 8D; that is, it is comprised of information from the mutually different 108 encoded packets EP. This is because, if the same number is present at two locations in one item of packet data PD, for example, as shown in FIG. 8E when the packet data PD is generated, a number 155 is present at two locations in a condition where six packet-unit interleave packets PIP to be linked one after another each having a phase difference of the four packet-unit interleave packets PIP with respect to those of FIG. 8D, each encoded packet EP contains 24 bytes of information, so that if, for example, one upper layer packet ULP is lost on the communication path, such a condition occurs that an encoded packet EP' having error data quantity that cannot be accommodated even by a maximum error correction capability of the decoder 20 may be generated, thereby making it impossible to completely correct errors.

Therefore, the packeting portion 14 generates packet data PD by linking one after another consecutive six packet-unit interleave packets PIP of a sequence of packet-unit interleave packets PIP in such a manner that information from the same encoded packet EP may not be contained. Note here that in a case where folding interleaving is performed by the packet interleaver 13, the packeting portion 14 may link arbitrary six consecutive packet-unit interleave packets PIP one after another irrespective of the position of a sink byte whose value has been inverted by the packet interleaver 13. However, in a case where block interleaving is performed by the packet interleaver 13, the packeting portion 14 links one after another consecutive six packet-unit interleave packets PIP starting from a position of a sink byte that indicates the beginning of an interleave block. The packeting portion 14 supplies the generated packet data PD to its downstream-side transmission portion 15.

The transmission portion 15, to transmit packet data PD supplied from the packeting portion 14 in accordance with the RTP and the transmission control protocol/Internet protocol (TCP/IP) using the so-called user datagram protocol (UDP) as a transport layer protocol, adds an RTP/UDP/IP packet header to each of the items of packet data PD to generate one upper layer packet ULP and transmits it as transmit data TD comprised of plural upper layer packets ULP. Further, the transmission portion 15, to generate an RTP packet, sets a sequence No. to the RTP header. Thus, by setting a sequence No., the reception side can verify consecutiveness of the sequence Nos. to detect a loss of packets as described later.

The encoder 10 having these portions outputs a transport stream TS input to it as an information series, as transmit data TD. FIGS. 9A-9F show transition of a packet format in the encoder 10 in a case where folding interleaving is performed by the packet interleaver 13. Further, FIGS. 10A-10E show transition of the packet format in the encoder 10 in a case where block interleaving is performed by the packet interleaver 13.

That is, when a transport stream TS comprised of plural transport packets TSP shown in FIG. 9A (or FIG. 10A) is input, the encoder 10 performs Reed-Solomon encoding on each of these transport packets TSP by using the Reed-Solomon-encoding portion 11, to generate encoded data ED comprised of plural encoded packets EP shown in FIG. 9B (or FIG. 10B). With this, of course, a quantity of information contained in one encoded packet EP indicated by a solid grid in FIG. 9B (or FIG. 10B), more precisely, the information quantity of the encoded packet EP except for an added error correcting code is the same as that of the transport packet TSP as indicated by the solid grid in FIG. 9A (or FIG. 10B) even if Reed-Solomon encoding is performed on the transport packet TSP by the Reed-Solomon-encoding portion 11 and an order of a series of the encoded packets EP is also the same as that of a series of the transport packets TSP.

Then, as shown in FIG. 9C (or 10C), the encoder 10 performs folding interleaving in units of a byte or a unit on each of the encoded packets EP by using the byte interleaver 12, to generate byte interleave data BID comprised of plural byte interleave packets BIP in which information contained in one encoded packet EP indicated by a solid grid in FIG. 9B (or FIG. 10B) are dispersed by 12 bytes, for each byte or unit, into consecutive eighteen interleave packets BIP as indicated by a hatched portion shown in FIG. 9C (or FIG. 10C). Note here that the hatched portions in FIGS. 9C (or 10C) and FIG. 9D (or FIG. 10D) show a condition where information of one encoded packet EP indicated by the solid grid in FIG. 9B (or FIG. 10B) is dispersed into consecutive eighteen byte interleave packets BIP.

Then, the encoder 10 performs folding interleaving with a depth of 6 and a period of 4 on each of the byte interleave packets BIP in units of a byte interleave packets, to generate packet interleave data PID comprised of plural packet-unit interleave packets PIP in which information of 24 byte interleave packets BIP as shown in FIG. 9D is sporadically dispersed into consecutive 144 packet-unit interleave packets PIP as shown in FIG. 9E and information of 12 bytes is dispersed with a spacing of at least six packet-unit interleave packets PIP therebetween. Therefore, the information contained in one encoded packet EP indicated by the solid grid in FIG. 9B is dispersed as indicated by the hatched portion in FIG. 9E.

Further, the encoder 10 performs block interleaving with a depth of 6 that is completed with consecutive 108 packets of a byte interleave packet BIP on each of the byte interleave packets BIP, to generate packet interleave data PID in which information of 18 byte interleave packets BIP as shown in FIG. 10C is sporadically dispersed into consecutive 108 packet-unit interleave packets PIP as shown in FIG. 10D and information of 12 bytes is dispersed into groups each having consecutive six packet-unit interleave packets PIP starting from the beginning of an interleave block in a one-to-one relationship. Therefore, information contained in one encoded packet EP indicated by the solid grid in FIG. 10B is dispersed as indicated by the hatched portions in FIG. 10D.

Then, as shown in FIG. 9F (or FIG. 10E), the encoder 10 links one after another consecutive six packet-unit interleave packets PIP by using the packeting portion 14 to generate the packet data PD and, by using the transmission portion 15, adds an RTP/UDP/IP packet header to each of the items of packet data PD to transmit it as transmit data TD comprised of plural upper layer packets ULP.

Thus, by performing folding interleaving in units of a byte or a unit on the encoded packets EP to each of which a Reed-Solomon code is added and interleaving in units of a packet, the encoder 10 can send transmit data TD that has an error correction capability which enables correcting a significant burst error containing a packet loss by using a Reed-Solomon code having a small code length. That is, even if a burst error has occurred in information contained in up to one upper layer packet ULP such as a case where one upper layer packet ULP is lost on the communication path, the encoder 10 can send transmit data TD that has an error correction capability which enables completely correcting a burst error containing this packet loss by using the decoder 20.

Further, to perform interleaving in units of a packet, the encoder 10 can replace a value of a sink byte which is beginning data of a first packet-unit interleave packet PIP by utilizing a fact that the beginning data of the packet has a fixed value, to notify the reception side of a beginning packet in the packet interleave data PID or a beginning packet in an interleave block when block interleaving is performed.

Furthermore, the encoder 10 can install the byte interleaver 12 by mounting the built-in DPRAM having a relatively small capacity into a programmable device and the packet interleaver 13 by mounting the SDRAM 16 having a relatively large capacity externally to the programmable device, thereby saving on memory resources provided in the programmable device and simplifying peripheral circuits due to burst access to the SDRAM 16. Thus, by performing two-stage interleaving by use of the DPRAM and the SDRAM 16, the encoder 10 can complementarily avoid disadvantages of these memories and, when performing interleaving in units of a packet, use the externally mounted SDRAM 16 instead of the small-capacity DPRAM incorporated in the programmable device, thereby reducing the costs and performing high-speed operations by accessing the SDRAM 16 in units of a packet.

Transmit data TD sent by such an encoder 10 propagates through a predetermined communication path and is received by the decoder 20 as receive data RD comprised of plural upper layer packets ULP.

The following will describe the decoder 20 in a data transmission/reception system.

As shown in FIG. 1 for example, the decoder 20 has a reception portion 21 for receiving and analyzing receive data RD comprised of plural upper layer packets ULP', a packet consecutiveness verification portion 22 for verifying consecutiveness of upper layer packets ULP' on the basis of a header added to the receive data RD received by this reception portion 21, an un-packeting portion 23 for dividing packet data PD' from which the header is removed when they are received by the reception portion 21, into packet-unit interleave packets PIP; a packet de-interleaver 24 for performing de-interleaving on the packet interleave data PID' in units of a packet in such a manner as to restore an order of the plurality packet-unit interleave packets PIP' divided by this un-packeting portion 23 to an order of byte interleave packets BIP that constitute original byte interleave data BID, a byte de-interleaver 25 for performing folding de-interleaving on the byte interleave data BID' in such a manner as to restore an order of the plural byte interleave packets BIP' on which de-interleaving is performed by this packet de-interleaver 24 to an order of the encoded packets EP that constitute the original encoded data ED, and a Reed-Solomon-decoding portion 26 for decoding a Reed-Solomon code of each of the encoded packets EP' of the encoded data ED' on which folding de-interleaving is performed by this byte de-interleaver 25, to output a transport stream TS comprised of plural transport packets TSP.

In the decoder 20, of these portions, at least the packet consecutiveness verification portion 22, the un-packeting portion 23, an interface portion 28 in the packet de-interleaver 24, the byte de-interleaver 25, and the Reed-Solomon-decoding portion 26 which are enclosed by a broken line in the figure are mounted as a programmable device such as a PLD or an FPGA.

The reception portion 21 is provided corresponding to the transmission portion 15 in the decoder 10; when having received the receive data RD through a predetermined communication path, it analyzes an RTP/UDP/IP packet header added to each of the plural upper layer packets ULP' that constitute this receive data RD. Specifically, the reception portion 21 analyzes a sequence No. of an RTP in the RTP/

UDP/IP packet header. The reception portion 21 supplies the packet consecutiveness verification portion 22 with analyzed information AN that indicates the sequence No. of the analyzed RTP and also supplies its downstream-side un-packeting portion 23 with packet data PD' generated by removing the RTP/UDP/IP packet header from each of the upper layer packets ULP'.

The packet consecutiveness verification portion 22, based on the analyzed information AN supplied from the reception portion 21, that is, the sequence No. of the RTP, verifies consecutiveness of the upper layer packets ULP' on whether, for example, any of the upper layer packets ULP' has been lost on the communication path. The packet consecutiveness verification portion 22 supplies verification result information CK that indicates a result of this verification to the interface portion 28 in the packet de-interleaver 24.

The un-packeting portion 23 is provided corresponding to the packeting portion 14 in the encoder 10; it divides packet data PD' supplied from the reception portion 21 in such a manner as to restore packet data PD generated by the packeting portion 14 to the packet-unit interleave packet PIP before linking, thereby generating packet-unit interleave packets PIP'. The un-packeting portion 23 supplies its downstream side packet de-interleaver 24 with packet interleave data PID' comprised of the plural packet-unit interleave packets PIP' thus generated.

The packet de-interleaver 24 is provided corresponding to the packet interleaver 13 in the encoder 10; it performs such processing as to restore an order of packet interleave data PID on which interleaving is performed by the packet interleaver 13 to an order of byte interleave packets BIP that constitute the original byte interleave data BID. In this processing, in a case where the packet-unit interleave packets PIP' that constitute the packet interleave data PID' supplied from the un-packeting portion 23 have been generated by performing folding interleaving with a depth of 6 and a period of 4 in units of byte interleave packets as described above, it performs folding de-interleaving with a depth of 6 and a period of 4 in units of byte interleave packets on them, to generate byte interleave data BID' comprised of the plural byte interleave packets BIP'. In this case, the packet de-interleaver 24, based on a sink byte whose value is replaced by the packet interleaver 13, synchronizes a beginning packet in the packet interleave data PID' supplied from the un-packeting portion 23, thereby performing folding de-interleaving in units of byte interleave packets.

Further, if the packet-unit interleave packets PIP' are generated by performing block interleaving with a depth of 6 that is completed with 108 byte interleave packets as described above, it performs block de-interleaving with a depth of 6 that is completed with the 108 byte interleave packets, to generate byte interleave data BID' comprised of the plural byte interleave packets BIP'. In this case, the packet de-interleaver 24, based on a sink byte whose value is replaced by the packet interleaver 13, detects the beginning of an interleave block in the packet interleave data PID' supplied from the un-packeting portion 23 and synchronizes the packets, thus performing block de-interleaving in units of byte interleave packets.

Specifically, the packet de-interleaver 24, like the packet interleaver 13, comprises an SDRAM 27 which is externally attached to each of the portions mounted as a programmable device and the interface portion 28 for performing processing such as address generation and data transmission and reception for the purpose of performing data write and read operations to this SDRAM 27. The packet de-interleaver 24 sequentially transfers and writes items of packet interleave data PID' input to the interface portion 28 to the SDRAM 27 in accordance with a predetermined write address and sequentially reads the data written to this SDRAM 27 in accordance with a predetermined read address that is different from the write address, thereby performing de-interleaving on the packet interleave data PID' supplied from the un-packeting portion 23.

In this case, the packet de-interleaver 24 can accommodate such a situation that items of the packet interleave data PID' are not consecutive, on the basis of verification result information CK supplied from the packet consecutiveness verification portion 22. For example, if it knows on the basis of verification result information CK that one upper layer packet ULP' is lost on the communication path, the packet de-interleaver 24, when writing data to the SDRAM 27, skips a region enough to store six packet-unit interleave packets PIP' that are tantamount to the one upper layer packet ULP' to write the data on one hand and, on the other hand, reads data by performing ordinary de-interleaving in accordance with a predetermined read address. By performing such an operation, the data read from the SDRAM 27 is data in which a portion corresponding to the lost packet is replaced with data read from the same read address in a previous time slot, that is, invalid data.

The packet de-interleaver 24 restores a value "0×B7", "0×B8" of a sink byte replaced by the packet interleaver 13 of the data obtained through such an operation to an original value of "0×47", to generate byte interleave data BID' to be output finally. The packet de-interleaver 24 supplies its downstream side byte de-interleaver 25 with the byte interleave data BID' comprised of the plural byte interleave packets BIP' thus generated. Note here that the packet interleaver 24 has a function also as a reception buffer to achieve a purpose of, for example, absorption of jitter occurring on the communication path, so that the SDRAM 27 only needs to have a capacity to store the packet-unit interleave packets PIP' as many as at least 144 (in the case of performing folding de-interleaving with a depth of 6 and a period of 4) or 216 (in the case of performing block interleaving with a depth of 6 that is completed with 108 byte interleave packets) plus a little capacity to achieve the purpose.

The byte de-interleaver 25 is provided corresponding to the byte interleaver 12 in the encoder 12; it performs de-interleaving on each of the byte interleave packets BIP' that constitute byte interleave data BID' supplied from the packet de-interleaver 24 in such a manner as to restore an order of the byte interleave data BID on which folding interleaving is performed by the byte interleaver 12 to an order of encoded packets EP that constitute an original encoded data ED, thereby generating encoded data ED' comprised of plural encoded packets EP'. For example, if the byte interleave packets BIP' that constitute the byte interleave data BID' are generated by performing folding interleaving with a depth of 18 and a period of 12 in units of a byte as described above, it performs folding de-interleaving with depth of 18 and a period of 12 in units of a byte, to generate encode data ED' comprised of the plural encoded packets EP'. Further, if the byte interleave packets BIP' that constitute the byte interleave data BID' are generated by performing folding interleaving with a depth of 18 and a period of 3 in units of four bytes as described above, it performs folding de-interleaving with depth of 18 and a period of 3 in units of four bytes, to generate encoded data ED' comprised of the plural encoded packets EP'.

Specifically, the byte de-interleaver 25, like the byte interleaver 12, comprises a DPRAM capable of high-speed random access in units of a byte, an address generation portion for performing data write and read operations to this DPRAM, etc. The byte de-interleaver 25 sequentially transfers and writes items of input byte interleave data BID' to the DPRAM in accordance with a predetermined write address and sequentially reads items of the written data in accordance with a predetermined read address that is different from the write address, thereby performing folding de-interleaving on the byte interleave data BID' supplied from the packet de-interleaver 24.

Such a byte de-interleaver 25 supplies its down-stream side Reed-Solomon-decoding portion 26 with encoded data ED' comprised of the plural encoded packet EP' thus generated. The encoded data ED' on which folding de-interleaving is performed by this byte de-interleaver 25 enters such a condition that 12-byte error data is contained in each of the 18×6=108 encoded packets EP' if, for example, one upper layer packet ULP' is lost on the communication path.

Note here that like the byte interleaver 12, this byte de-interleaver 25 can control addresses according to a predetermined address generation system, to reduce a capacity of a memory required to perform folding de-interleaving, that is, the DPRAM, which will be described later.

The Reed-Solomon-decoding portion 26 is provided corresponding to the Reed-Solomon-encoding portion 11 in the encoder 10; it performs decoding of a Reed-Solomon code on each of the encoded packets EP' that constitute the encoded data ED' supplied from the byte de-interleaver 25, to restore a transport stream TS comprised of plural transport packets TS. Specifically, the Reed-Solomon-decoding portion 26 performs error correction by using a 28-byte error correction code as a parity contained in each of the 216-byte encoded packets EP', to restore and output the transport stream TS comprised of 188-byte transport packets TSP. If, for example, one upper layer packet ULP' is lost on the communication path, this Reed-Solomon-decoding portion 26 can completely correct all bits because it can correct up to 14 bytes against a maximum number of error bytes contained in an arbitrary encoded packet EP' of 12.

The decoder 20 having such portions completely restores the transport stream TS input as an information sequence to the encoder 10 from the receive data RD received through the predetermined communication path and outputs it. FIGS. 11A-11E explain transition of the packet format in the portions in the decoder 20 when folding interleaving processing is performed in units of a packet by the packet interleaver. Further, FIGS. 12A-12F explain transition of the packet format in the portions in the decoder 20 when block interleaving processing is performed in units of a packet by the packet interleaver.

That is, the decoder 20, when having received the receive data RD through the reception portion 21 to generate packet data PD' shown in FIG. 11A (FIG. 12A), divides these items of packet data PD' by using the un-packeting portion 23, to generate packet interleave data PID' comprised of plural packet-unit interleave packets PIP' shown in FIG. 11B (FIG. 12B). It is supposed that the receive data RD is such that one upper layer packet ULP' is lost on the communication path and packet data PD' and a packet-unit interleave packet PIP' that correspond to this lost upper layer packet ULP' are such as indicated by horizontal lines in FIG. 11A (FIG. 12A) and FIG. 11B (FIG. 12B).

At this moment, information contained in one encoded packet EP generated by the encoder 10 is sporadically dispersed into consecutive 144 packet-unit interleave packets PIP' as indicated by hatched portions in FIGS. 11A and 11B when folding interleaving processing is performed in units of a packet and the information is dispersed by 12 bytes with a spacing of at least six packet-unit interleave packets PIP' therebetween.

The decoder 20 performs folding de-interleaving by using the packet de-interleaver 24 on each of the packet-unit interleave packets PIP' in units of a packet, to generate byte interleave data BID' comprised of plural byte interleave packets BIP' dispersed into consecutive 18 byte interleave packets BIP' of 12 bytes, which are indicated by the hatched portion and the horizontal line in FIG. 11C. In this case, the decoder 20, based on verification result information CK supplied from the packet consecutiveness verification portion 22, replaces data that corresponds to the lost upper layer packet ULP' with invalid data, to generate byte interleave data BID' containing byte interleave packets BIP' indicated by the horizontal line having "?" attached to it in FIG. 11C.

Furthermore, as shown in FIG. 11D, the decoder 20 performs folding interleaving on each of the byte interleave packets BIP' by using the byte de-interleaver 25, to generate encoded data ED' comprised of plural encoded packets EP'. It is thus possible to handle an extremely significant burst error as large as 216×6=1296 bytes owing to one lost upper layer packet ULP' as pieces of an at most 12-byte random error dispersed into the encoded packets EP' as indicated by a cross-hatched portion in FIG. 11D.

Further, when block interleaving processing is performed in units of a packet, information contained in one encoded packet EP generated by the encoder 10 is sporadically dispersed into consecutive 108 packet-unit interleave packets PIP' as indicated by the hatched portion in FIGS. 12A and 12B in such a condition that information is dispersed by 12 bytes into groups that each comprise consecutive six packet-unit interleave packets PIP' starting from the beginning of an interleave block in an one-to-one relationship.

The decoder 20 performs block de-interleaving on each of the packet-unit interleave packets PIP' in units of a packet by using the packet de-interleaver 24. In this case, when performing the block de-interleaving in units of a packet, it utilizes a sink byte to detect the beginning of the interleave block in the packet interleave data PID' and an RTP packet. FIG. 12B shows a result of detecting the sink byte, in which "B" indicates the beginning of the interleave block and "P" indicates a beginning position of the RTP packet.

As shown in FIG. 12C, the packet de-interleaver 24 performs block de-interleaving using the 108 packet-unit interleave packets PIP' starting from the beginning of the detected interleave block, to generate the byte interleave data BID' comprised of plural byte interleave packets BIP' obtained by dispersing information contained in one encoded packet EP generated by the encoder 10 by 12 bytes into the consecutive 18 byte interleave packets BIP' as indicated by the hatched portion and the horizontal line in FIG. 12D. In this case, the decoder 20, based on verification result information CK supplied from the packet consecutiveness verification portion 22, replaces data that corresponds to the lost upper layer packet ULP' with invalid data, to generate the byte interleave data BID' containing the byte interleave packets BIP' indicated by the horizontal line having "?" attached to it in FIG. 12D.

Furthermore, as shown in FIG. 12D, the decoder 20 performs folding de-interleaving on each of the byte interleave packets BIP' by using the byte de-interleaver 25, to generate the coded data ED' comprised of plural encoded packets EP'. It is thus possible to handle an extremely significant burst error as large as 216×6=1296 bytes owing to one lost upper layer packet ULP' as pieces of an at most 12-byte random error dispersed into the encoded packets EP' as indicated by the cross-hatched portion in FIG. 12E.

Note here that the dispersed information indicated by the hatched portions in FIGS. 11A and 11B is integrated into one transport packet TSP as indicated by the solid grid in FIG. 11E. Further, the dispersed information indicated by the hatched portions in FIGS. 12A and 12B is integrated into one transport packet TSP as indicated by the solid grid in FIG. 12F.

As shown in FIGS. 11E and 12F, then, the decoder 20 decodes a Reed-Solomon code by using the Reed-Solomon-decoding portion 26, to generate a transport stream TS comprised of plural transport packets TSP whose errors are completely corrected.

In such a manner, even if such the receive data RD is received that a burst error has occurred in information contained in at most one upper layer packet ULP', the decoder 20 can completely correct this burst error. In this case, even if the receive data RD comprised of plural upper layer packets ULP' is received in a condition where one of the upper layer packets ULP' in the transmit data TD generated by the encoder 10 is lost on the communication path, the decoder 20 can replaces lost blank data with invalid data to regard it as a burst error, thereby completely restoring information that corresponds to the lost upper layer packet ULP'.

Further, like the encoder 10, the decoder 20 can install the byte de-interleaver 25 by using the small-capacity DPRAM incorporated in the programmable device and the packet de-interleaver 24 by using the SDRAM 27 with a relatively large capacity that is externally mounted to the programmable device, thereby saving on memory resources provided in the programmable device and simplifying peripheral circuits owing to burst access to the SDRAM 27. By thus performing two-stage de-interleaving by use of the DPRAM and the SDRAM 27, like the encoder 10, the decoder 20 can complementarily avoid disadvantages of these memories and, when performing de-interleaving in units of a packet, use the externally mounted SDRAM 27 instead of the small-capacity DPRAM incorporated in the programmable device, thereby reducing the costs and performing high-speed operations by accessing the SDRAM 27 in units of a packet.

Note here that the byte interleaver 12 in the encoder 10 and the byte de-interleaver 25 in the decoder 20 can control addresses according to the predetermined address generation system as described above, to reduce the capacity of the memories required to perform folding interleaving and folding de-interleaving respectively in units of a byte or a unit. It is detailed as follows.

To use the DPRAM as a memory in performing folding interleaving or folding de-interleaving in units of a byte or a unit, typically, the writing side to the DPRAM rearranges data, in terms of order, required to perform folding interleaving or folding de-interleaving, while on the other hand the reading side sequentially reads packets stored in the DPRAM one by one starting from its beginning address. Conversely, the writing side can sequentially write the packets one by one starting from the beginning address of the DPRAM, while the reading side from DPRAM can rearrange data, in terms of order, required to perform folding interleaving or folding de-interleaving, thereby performing folding interleaving or folding de-interleaving in units of a byte or a unit. Therefore, in the DPRAM, even if there is a region from which data is read because it is already used to perform folding interleaving or folding de-interleaving, this region is not used immediately after the data is read and enters such a condition that about half a region reserved for folding interleaving or folding de-interleaving is left unused.

Therefore, the byte interleaver 12 and the byte de-interleaver 25, when they have read data from a certain region in the DPRAM, each write the data to be next written to this region, thereby realizing folding interleaving or folding de-interleaving. That is, the byte interleaver 12 and the byte de-interleaver 25 eliminate used blank regions in the DPRAM so that only such significant data as to be used hereafter in folding interleaving or folding de-interleaving may always be stored in a preserved region. In such a manner, the byte interleaver 12 and the byte de-interleaver 25 can each minimize the capacity of the DPRAM required to perform folding interleaving or folding de-interleaving.

To realize data write and read operations to such a DPRAM, the byte interleaver 12 and the byte de-interleaver 25 control addresses in accordance with an address generation system described with reference to FIGS. 13A through 24.

The following will describe it with reference to a case where interleaving and de-interleaving are performed in units of a byte and a unit. To simplify the description thereof, it is assumed that to perform interleaving and de-interleaving in units of a byte, interleaving is performed with a depth of 4 and a period of 3 on 12-byte encoded packet EP by the byte interleaver 12, to generate byte interleave data BID of 12 bytes and folding de-interleaving with a depth of 4 and a period of 3 is performed on byte interleave BID' by the byte de-interleaver 25, to generate 12-byte encoded packet EP'. Further, the description is made also based on the assumption that to perform interleaving or de-interleaving in units of a unit, regarding each two bytes as one unit, folding interleaving with a depth of 4 and a period of 3 is performed on a 24-byte encoded packet EP in units of a unit by using the byte interleaver 12, to generate byte interleave data BID of 24 bytes and de-interleaving with a depth of 4 and a period of 3 is performed on byte interleave data BID' in units of a unit by using the byte de-interleaver 25, to generate 24-byte encoded packets EP'.

Note here that although when the byte interleaver 12 and the byte de-interleaver 25 ordinarily perform folding interleaving and folding de-interleaving with a depth of 4 and a period of 3 respectively on an encoded packet EP comprised of such a number of bytes as to be equal to a product of the depth of the folding interleaving or folding de-interleaving and the number of bytes per packet, for example, 12 bytes as described above, a memory having a capacity of 12×4=48 bytes is used in mounting, such a memory as to have a smaller capacity is used to enable the mounting.

First, operations in the case of performing the processing in units of a byte are described as follows. The byte interleaver 12 classifies bytes of a certain encoded packet EP in accordance with how much these bytes are delayed from their belonging packets to storage packets when folding interleaving is performed on them. Furthermore, these classified bytes are collectively managed in consecutive addresses on a memory map in the DPRAM. It is here assumed that the number of packets delayed with respect to an original packet to which a certain byte belongs is referred to as a "delay" and a group of bytes having the same number of delay packets is referred to as a "delay group". That is, the byte interleaver 12 classifies such bytes of an arbitrary encoded packet EP that these bytes may have the same number of delay packets which is the number of delays of a byte interleave packet BIP in which these bytes are stored when folding interleaving is performed on this encoded packet EP, into one delay group. Furthermore, it handles data for each of these delay groups by generating a write address and a read address so that write and read operations may be performed to consecutive addresses in the DPRAM for each of the delay groups.

To classify the bytes of a certain encoded packet EP into such a delay group, the byte interleaver 12 is provided with, as an address generation portion, two auxiliary counters, although not shown, for assisting in calculation of write and read addresses used to perform data write and read operations to the DPRAM. Specifically, assuming that incoming 12-byte encoded packets EP are assigned packet Nos. 0, 1, 2, 3, . . . as shown in FIG. 13A and bytes of each of these encoded packets EP are assigned byte Nos. 0-11 as shown in FIG. 13B, the byte interleaver 12 is provided with, as auxiliary counters, a first counter for counting for each of the packets by incrementing count value cnt_del (0-3) that corresponds to a depth 4 of folding interleaving according to the byte No. as shown in FIG. 13C and a second counter for counting for each of the packets by incrementing count value cnt_block (0-2) that corresponds to a period of the first counter as shown in FIG. 13D.

Note here that count value cnt_del given by the first counter indicates the above-mentioned number of delay packets, that is, a delay, while count value cnt_block given by the second counter indicates the number of block assuming a period of the first counter to be one block.

The byte interleaver 12 uses such count value cnt_del given by the first counter and count value cnt_block given by the second counter, to control data write and read operations to the DPRAM, thereby performing folding interleaving on the encoded packets EP. In this case, the byte interleaver 12, when having received encoded packets EP to undergo folding interleaving, starts writing data to the DPRAM immediately, while it starts reading data from the DPRAM simultaneously with data writing or as delayed by a predetermined fixed number of clock. When having received an encoded packet EP, to avoid such a situation that significant data written to the DPRAM may be overwritten by any other data before the significant data is read, the byte interleaver 12 needs to read all the data completely before the next encoded packet EP is input after the data is written to the DPRAM.

Specifically, the byte interleaver 12 performs write and read operations of bytes classified into delay groups to the DPRAM as shown in, for example, FIGS. 14A-14D. It is supposed here that a group of bytes for each packet No. comprised of three bytes in accordance with count value cnt_del of "0" is referred to as delay group del0, a group of bytes for each packet No. comprised of three bytes in accordance with count value cnt_del of "1" is referred to as delay group del1, a group of bytes for each packet No. comprised of three bytes in accordance with count value cnt_del of "2" is referred to as delay group del2, and a group of bytes for each packet No. comprised of three bytes in accordance with count value cnt_del of "3" is referred to as delay group del3. Further, in FIGS. 14B-14D, delay groups del0, del1, del2, and del3 in an encoded packet EP with a packet No. of "n" are supposed to be written as "n-0", "n-1", "n-2", and "n-3" respectively.

That is, in preparation for performing folding interleaving, the byte interleaver 12 sets to a predetermined initial value such as "0" an reference address addr_base that is an address of the DPRAM at a moment when the first and second counters are released from a reset state and that indicates a beginning from which data write and read operations to the DPRAM start as indicated by a bold horizontal line in the leftmost portion in FIG. 14B. Then, when having received an encoded packet EP having packet No. "0" as indicated by the leftmost packet No. in FIG. 14A, it classifies bytes of this encoded packet EP into four three-byte delay groups of del0 (0-0), del1 (0-1), del2 (0-2), and del3 (0-3) on the basis of count value cnt_del given by the first counter as indicated by the leftmost portion in FIG. 14B. That is, in the packet of packet No. "0", the bytes of byte Nos. "0, 4, and 8", those of byte Nos. "1, 5, and 9", those of byte Nos. "2, 6, and 10", and those of byte Nos. "3, 7, and 11" are classified into del0 (0-0), del1 (0-1), del2 (0-2), and del3 (0-3) respectively.

Further, the byte interleaver 12 generates a write address in such a manner as to, as indicated by the leftmost portion in FIG. 14C, avoid writing the bytes belonging to delay group del1 (0-0) of these four delay groups del0 (0-0), del1 (0-1), del2 (0-2), and del3 (0-3) to the DPRAM and, instead, write the bytes belonging to delay group del1 (0-1) to region w1 which is two blocks ahead of the above-mentioned reference address addr_base in the DPRAM, the bytes belonging to delay group del2 (0-2) to region w2 which is (2+3) blocks ahead of the above-mentioned reference address addr_base in the DPRAM, the bytes belonging to delay group del3 (0-3) to a region which is (2+3+4) blocks ahead of the above-mentioned reference address addr_base in the DPRAM, that is, the circulated beginning region w3.

Further, the byte interleaver 12 performs a read operation as well as such a write operation to the DPRAM. That is, the byte interleaver 12 uses the bytes belonging to delay group del0 of four delay groups del0, del1, del2, and del3 written in the DPRAM as they are because these bytes are not written to the DPRAM. Further, it generates a read address in such a manner as to read the bytes belonging to delay group del1 from region r1 which is one block behind the reference address addr_base in the DPRAM, the bytes belonging to delay group del2 from region r2 which is (1+2) blocks behind the reference address addr_base in the DPRAM, and the bytes belonging to delay group del3 from region r3 which is (1+2+3) blocks behind the reference address addr_base in the DPRAM. However, since no data is written in either of regions r1, r2, or r3 at this moment, there is actually no data to be read by the byte interleaver 12.

Therefore, the byte interleaver 12 outputs data comprised of the bytes classified as delay group del0 (0-0) as indicated by the leftmost portion in FIG. 14D.

Subsequently, in preparation for inputting the next encoded packet EP, the byte interleaver 12 moves forward the reference address addr_base by one block as indicated by the bold horizontal line in the second leftmost portion in FIG. 14B and, as indicated by the second leftmost portion in FIG. 14A, inputs the next encoded packet EP with packet No. "1" and, as indicated by the second leftmost portion in FIG. 14B, classifies the bytes that constitute this encoded packet EP into four three-byte groups del0 (1-0), del1 (1-1), del2 (1-2), and del3 (1-3) on the basis of count value cnt_del given by the first counter.

Then, the byte interleaver 12, as indicated by the second leftmost portion in FIG. 14C, avoid writing to the DPRAM the bytes of delay group del0 (1-0) of these four delay groups del0 (1-0), del1 (1-1), del2 (1-2), and del3 (1-3) and, instead, writes the bytes belonging to delay groups del1 (1-1), del2 (1-2), and del3 (1-3) to the region to which a read operation was performed before the encoded packet EP has been input. That is, it generates a write address in such a manner as to write the bytes belonging to delay group del1 (1-1) to region w1 (=region r2 for the previous packet No.) which is two blocks behind the reference addr_base in the DPRAM, the bytes belonging to delay group del2 (1-2) to region w2 (=region r3 for the previous packet No.) which is (2+3) blocks behind the reference address addr_base in the DPRAM, the bytes belonging to delay group del3 (1-3) to the region which is (2+3+4) blocks behind the reference address addr_base in the DPRAM, that is, the circulated beginning region w3 (=region r1 for the previous packet No.).

Further, the byte interleaver 12 uses the bytes belonging to group del0, of four delay groups del0, del1, del2, and del3 written to the DPRAM, as they are because they are not written to the DPRAM. Further, it generates a read address in such a manner as to read the bytes belonging to delay group del1 from region r1 which is one block behind the reference address addr_base in the DPRAM, the bytes belonging to delay group del2 from region r2 which is (1+2) blocks behind the reference address addr_base in the DPRAM, and the bytes belonging to delay group del3 from region r3 which is (1+2+3) blocks behind the reference address addr_base in the DPRAM. Note here that the byte interleaver 12 actually reads only delay group del1 (0-1) because no data is written to regions r2 and r3 and region r1 is the same as region w1 at the time when an encoded packet EP with packet No. "0" is input and delay group del1 (0-1) is written in it.

Accordingly, the byte interleaver 12, as indicated by the second leftmost portion in FIG. 14D, outputs data comprised of the bytes classified as delay groups del0 (1-0) and del1 (0-1).

Subsequently, in preparation for inputting the next encoded packet EP, the byte interleaver 12 moves forward the reference address addr_base another one block as indicated by the bold horizontal line in the third leftmost portion in FIG. 14B and, as indicated by the third leftmost portion in FIG. 14A, inputs the next encoded packet with packet No. "2" and, as indicated by the third leftmost portion in FIG. 14B, classifies the bytes that constitute this encoded packet EP into four three-byte delay groups del0 (2-0), del1 (2-1), del2 (2-2), and del3 (2-3) on the basis of count value cnt_del given by the first counter.

Then, the byte interleaver 12 generates a write address in such a manner as to, as indicated by the third leftmost portion in FIG. 14C, avoid writing the bytes belonging to delay group del1 (2-0) of these four delay groups del0 (2-0), del1 (2-1), del2 (2-2), and del3 (2-3) to the DPRAM and, instead, write the bytes belonging to delay group del1 (2-1) to region w1 which is two blocks behind the reference address addr_base in the DPRAM, the bytes belonging to delay group del2 (2-2) to region w2 which is (2+3) blocks behind the reference address addr_base in the DPRAM, the bytes belonging to delay group del3 (2-3) to a region which is (2+3+4) blocks behind the reference address addr_base in the DPRAM, that is, the circulated beginning region w3.

Further, the byte interleaver 12 uses the bytes belonging to delay group del0 of four delay groups del0, del1, del2, and del3 written in the DPRAM as they are because these bytes are not written to the DPRAM. Further, it generates a read address in such a manner as to read the bytes belonging to delay group del1 from region r1 which is one block behind the reference address addr_base in the DPRAM, the bytes belonging to delay group del2 from region r2 which is (1+2) blocks behind the reference address addr_base in the DPRAM, and the bytes belonging to delay group del3 from region r3 which is (1+2+3) blocks behind the reference address addr_base in the DPRAM. At this moment, since no data is written in regions r3 and region r1 is the same as region w1 at the time when an encoded packet with packet No. "1" is input and region r2 is the same as region w2 at the time when an encoded packet EP with packet No. "0" is input and has delay groups del1 (1-1) and del2 (0-2) written in it, the byte interleaver 12 actually reads only these delay groups del1 (1-1) and del2 (0-2).

Accordingly, the byte interleaver 12 outputs data comprised of the bytes classified as delay groups del0 (2-0), del1 (1-1), and del2 (0-2) as indicated by the third leftmost portion in FIG. 14D.

Similarly, in preparation for inputting the next encoded packet EP, the byte interleaver 12 moves forward the reference address addr_base by another one block as indicated by the bold horizontal line in the fourth leftmost portion in FIG. 14B and, as indicated by the fourth leftmost portion in FIG. 14A, inputs the next encoded packet EP with packet No. "3" and, as indicated by the fourth leftmost portion in FIG. 14B, classifies the bytes that constitute this encoded packet EP into four three-byte groups del0 (3-0), del1 (3-1), del2 (3-2), and del3 (3-3) on the basis of count value cnt_del given by the first counter.

Then, the byte interleaver 12 generates a write address in such a manner as to, as indicated by the fourth leftmost portion in FIG. 14C, avoid writing to the DPRAM the bytes of delay group del0 (3-0) of these four delay groups del0 (3-0), del1 (3-1), del2 (3-2), and del3 (3-3) and, instead, write the bytes belonging to delay groups del1 (3-1) to region w1 which is two blocks behind the reference addr_base in the DPRAM, the bytes belonging to delay group del2 (3-2) to region w2 which is (2+3) blocks behind the reference address addr_base in the DPRAM, the bytes belonging to delay group del3 (3-3) to a region which is (2+3+4) blocks behind the reference address addr_base in the DPRAM, that is, the circulated beginning region w3.

At this moment, details of the data mapped to the addresses in the DPRAM are such as shown in FIG. 15. That is, in the byte interleaver 12, as for the regions that can store three-byte blocks of addresses 0-2, delay group del3 (0-3) which has packet No. "0" and the number of delay packets "3" is stored, in which the bytes belonging to these delay groups are written to the consecutive addresses starting from those having the lower numbered byte Nos. in such a manner that the data with byte No. "3" may be stored in a region of address 0, the data with byte No. "7" may be stored in a region of address 1, and the data with byte No. "11" may be stored in a region of address 2.

Further, the byte interleaver 12 generates a read address in such a manner as to, as indicated by the fourth leftmost portion in FIG. 14C, read the bytes belonging to delay group del0 as they are because they are not written to the DPRAM, the bytes belonging to delay group del1 from region r1 which is one block behind the reference address addr_base in the DPRAM, the bytes belonging to delay group del2 from region r2 which is (1+2) blocks behind the reference address addr_base in the DPRAM, and the bytes belonging to delay group del3 from region r3 which is (1+2+3) blocks behind the reference address addr_base in the DPRAM. In this case, region r1 is the same as region w1 at the time when an encoded packet EP with packet No. "2" is input, region r2 is the same as region w2 at the time when an encoded packet EP with packet No. "1" is input, and region r3 is the same as region w3 at the time when an encoded packet EP with packet No. "0" is input and has delay groups del1 (2-1), del2 (1-2), and del3 (0-3) written in it, so that the byte interleaver 12 actually reads these delay groups del1 (2-1), del2 (1-2), and del3 (0-3).

Accordingly, the byte interleaver 12 outputs data comprised of the bytes classified as delay groups del0 (3-0), del1 (2-1), del2 (1-2), and del3 (0-3) as indicated by the fourth leftmost portion in FIG. 14D.

In such a manner, the byte interleaver 12 classifies the bytes into the delay groups each time an encoded packet EP is input and, based on write and read addresses in accordance with the above-mentioned address generation system, performs managed write and read operations to the consecutive addresses on a memory map in the DPRAM for each of the delay groups. With this, the byte interleaver 12 can immediately write the next data to the data storage region from which data is read and on which interleaving is performed completely, as a region to which the next data is written. That is, it is possible to eliminate a useless region (i.e., a region on which interleaving is performed completely and in which data is left as written) of the DPRAM regions, thus minimizing a required capacity of the DPRAM. In this case, although typically the byte interleaver 12 requires such a DPRAM as to have a capacity equal to a product of a depth D (=4) of folding interleaving and the number of bytes N (=12) per input packet, that is, D×N (=4×12=48) bytes, it only need to use such a DPRAM as to have a capacity of only nine three-byte regions, that is, 27 bytes as shown in FIG. 14C by performing the above-mentioned address control, in order to perform the similar folding interleaving. Further, the byte interleaver 12 can perform a write operation to consecutive addresses for each of the classified delay groups and a read operation to these consecutive addresses for each of the written delay groups, thereby easily calculating a write address and a read address.

Next, the byte de-interleaver 25 will be described.

The byte de-interleaver 25, like the byte interleaver 12, classifies bytes that constitute a byte interleave packet BIP' into delay groups and handles data for each of these delay groups, to perform address control symmetrical to the byte interleaver 12, thereby performing folding de-interleaving.

That is, the byte de-interleaver 25, like the byte interleaver 12, is provided with, as an address generation portion, two auxiliary counters, although not shown, for assisting in calculation of write and read addresses used to perform data write and read operations to the DPRAM. Specifically, assuming that incoming byte interleave packets BIP' of 12 bytes are assigned packet Nos. 0, 1, 2, 3, . . . as shown in FIG. 16A and bytes of each of these byte interleave packets BIP' are assigned byte Nos. 0-11 as shown in FIG. 16B, the byte de-interleaver 25 is provided with, as auxiliary counters, a first counter for counting for each of the packets by decrementing count value cnt_del (0-3) that corresponds to a depth 4 of folding de-interleaving according to the byte No. as shown in FIG. 16C and a second counter for counting for each of the packets by incrementing count value cnt_block (0-2) that corresponds to a period of the first counter as shown in FIG. 16D. Note here that it differs from the byte interleaver 12 in that count value cnt_del given by the first counter is not incremented but decremented.

Like the byte interleaver 12, the byte de-interleaver 25 uses such count value cnt_del given by the first counter and count value cnt_block given by the second counter, to control data write and read operations to the DPRAM, thereby performing folding de-interleaving on the byte interleave packets BIP'. The byte de-interleaver 25, when having received byte interleave packets BIP' to undergo folding de-interleaving, starts writing data to the DPRAM immediately, while it starts reading data from the DPRAM simultaneously with data writing or as delayed by a predetermined fixed number of clock pulses. When having received a byte interleave packet BIP', to avoid such a situation that significant data written to the DPRAM may be overwritten by any other data before the significant data is read, the byte de-interleaver 25 needs to read all the data completely before the next byte interleave packet BIP' is input after the data is written to the DPRAM.

Specifically, when having received byte interleave packets BIP' comprised of a data array output from the byte interleaver 12, the byte de-interleaver 25 performs write and read operations of bytes classified into delay groups to the DPRAM as shown in, for example, FIGS. 17A-17D. It is supposed here, as in the case shown in FIG. 14B earlier, that a group of bytes for each packet No. comprised of three bytes in accordance with count value cnt_del of "0" is referred to as delay group del0, a group of bytes for each packet No. comprised of three bytes in accordance with count value cnt_del of "1" is referred to as delay group del1, a group of bytes for each packet No. comprised of three bytes in accordance with count value cnt_del of "2" is referred to as delay group del2, and a group of bytes for each packet No. comprised of three bytes in accordance with count value cnt_del of "3" is referred to as delay group del3.

That is, in preparation for performing folding de-interleaving, the byte de-interleaver 25 sets to a predetermined initial value such as "0" the reference address addr_base that is an address of the DPRAM at a moment when the first and second counters are released from a reset state and that indicates a beginning from which data write and read operations to the DPRAM start as indicated by the bold horizontal line in the leftmost portion in FIG. 17B. Then, when having received a byte interleave packet BIP' having packet No. "0" as indicated by the leftmost packet No. in FIG. 17A, it classifies bytes of this byte interleave packet BIP' into four three-byte delay groups of del0 (0-3), del1 (1-2), del2 (2-1), and del3 (3-0) based on count value cnt_del given by the first counter as indicated by the leftmost portion in FIG. 17B.

Note here that in contrast to FIG. 14B given earlier, in FIG. 17B, count value cnt_del given by the first counter and a value of "m" of a delay group written as "n-m" are made different from each other for the purpose of easily explaining how to restore an encoded packet EP' that corresponds to an encoded packet EP by performing folding interleaving on the byte interleave packet BIP'.

Then, the byte interleaver 25 generates a write address in such a manner as to, as indicated by the leftmost portion in FIG. 17C, avoid writing the bytes belonging to delay group del0 (0-3) of these four delay groups del0 (0-3), del1 (1-2), del2 (2-1), and del3 (3-0) to the DPRAM and, instead, write the bytes belonging to delay group del1 (1-2) to region w3 which is two blocks behind the above-mentioned reference address addr_base in the DPRAM, the bytes belonging to delay group del2 (2-1) to region w2 which is (2+3) blocks behind the reference address addr_base in the DPRAM, the bytes belonging to delay group del3 (3-0) to a region which is (2+3+4) blocks behind the reference address addr_base in the DPRAM, that is, the circulated beginning region w1.

Further, the byte de-interleaver 25 performs a read operation as well as such a write operation to the DPRAM. That is, the byte de-interleaver 25 uses the bytes belonging to delay group del0 of four delay groups del0, del1, del2, and del3 written in the DPRAM as they are because these bytes are not written to the DPRAM. Further, it generates a read address in such a manner as to read the bytes belonging to delay group del1 from region r3 which is one block behind the reference address addr_base in the DPRAM, the bytes belonging to delay group del2 from region r2 which is (1+2) blocks behind the reference address addr_base in the DPRAM, and the bytes belonging to delay group del3 from region r1 which is (1+2+3) blocks behind the reference address addr_base in the DPRAM. However, since no data is written in either of regions r1, r2, or r3 at this moment, there is actually no data to be read by the byte de-interleaver 25.

Therefore, the byte de-interleaver 25 outputs data comprised of the bytes classified as delay group del0 (0-3) as indicated by the leftmost portion in FIG. 17D.

Subsequently, in preparation for inputting the next byte interleave packet BIP', the byte de-interleaver 25 moves forward the reference address addr_base by one block as indicated by the bold horizontal line in the second leftmost portion in FIG. 17B and, as indicated by the second leftmost portion in FIG. 17A, inputs the next byte interleave packet BIP' with packet No. "1" and, as indicated by the second leftmost portion in FIG. 17B, classifies the bytes that constitute this byte interleave packet BIP' into four three-byte groups del0 (1-3), del1 (2-2), del2 (3-1), and del3 (0-0) on the basis of count value cnt_del given by the first counter.

Then, the byte de-interleaver 25, as indicated by the second leftmost portion in FIG. 17C, avoid writing to the DPRAM the bytes of delay group del0 (1-3) of these four delay groups del0 (1-3), del1 (2-2), del2 (3-1), and del3 (0-0) and, instead, writes the bytes belonging to delay groups del1 (2-2), del2 (3-1), and del3 (0-0) to each of the regions to which a read operation has been performed before the encoded packet EP is input. That is, it generates a write address in such a manner as to write the bytes belonging to delay group del1 (2-2) to region w3 (=region r2 for the previous packet No.) which is two blocks behind the reference addr_base in the DPRAM, the bytes belonging to delay group del2 (3-1) to region w2 (=region r1 for the previous packet No.) which is (2+3) blocks behind the reference address addr_base in the DPRAM, the bytes belonging to delay group del3 (0-0) to the region which is (2+3+4) blocks behind the reference address addr_base in the DPRAM, that is, the circulated beginning region w1 (=region r3 for the previous packet No.).

Further, the byte de-interleaver 25 uses the bytes belonging to group del0, of four delay groups del0, del1, del2, and del3 written to the DPRAM, as they are because they are not written to the DPRAM. Further, it generates a read address in such a manner as to read the bytes belonging to delay group del1 from region r3 which is one block behind the reference address addr_base in the DPRAM, the bytes belonging to delay group del2 from region r2 which is (1+2) blocks behind the reference address addr_base in the DPRAM, and the bytes belonging to delay group del3 from region r1 which is (1+2+3) blocks behind the reference address addr_base in the DPRAM. Note here that the byte de-interleaver 25 actually reads only delay group del1 (1-2) because no data is written to regions r1 and r2 and region r3 is the same as region w3 at the time when a byte interleave packet BIP' with packet No. "0" is input and delay group del1 (1-2) is written in it.

Accordingly, the byte de-interleaver 25, as indicated by the second leftmost portion in FIG. 17D, outputs data comprised of the bytes classified as delay groups del0 (1-3) and del1 (1-2).

Subsequently, in preparation for inputting the next byte interleave packet BIP', the byte de-interleaver 25 moves forward the reference address addr_base another one block as indicated by the bold horizontal line in the third leftmost portion in FIG. 17B and, as indicated by the third leftmost portion in FIG. 17A, inputs the next byte interleave packet with packet No. "2" and, as indicated by the third leftmost portion in FIG. 17B, classifies the bytes that constitute this byte interleave packet BIP' into four three-byte delay groups del0 (2-3), del1 (3-2), del2 (0-1), and del3 (1-0) on the basis of count value cnt_del given by the first counter.

Then, the byte de-interleaver 25 generates a write address in such a manner as to, as indicated by the third leftmost portion in FIG. 17C, avoid writing the bytes belonging to delay group del0 (2-3) of these four delay groups del0 (2-3), del1 (3-2), del2 (0-1), and del3 (1-0) to the DPRAM and, instead, write the bytes belonging to delay group del1 (3-2) to region w3 which is two blocks behind the reference address addr_base in the DPRAM, the bytes belonging to delay group del2 (0-1) to region w2 which is (2+3) blocks behind the reference address addr_base in the DPRAM, the bytes belonging to delay group del3 (1-0) to a region which is (2+3+4) blocks behind the reference address addr-base in the DPRAM, that is, the circulated beginning region w1.

Further, the byte de-interleaver 25 uses the bytes belonging to delay group del0 of four delay groups del0, del1, del2, and del3 written in the DPRAM as they are because these bytes are not written to the DPRAM. Further, it generates a read address in such a manner as to read the bytes belonging to delay group del1 from region r3 which is one block behind the reference address addr_base in the DPRAM, the bytes belonging to delay group del2 from region r2 which is (1+2) blocks behind the reference address addr_base in the DPRAM, and the bytes belonging to delay group del3 from region r1 which is (1+2+3) blocks behind the reference address addr_base in the DPRAM. At this moment, since no data is written in region r1 and region r2 is the same as region w2 at the time when a byte interleave packet with packet No. "0" is input and region r3 is the same as region w3 at the time when a byte interleave packet BIP' with packet No. "1" is input and has delay groups del2 (2-1) and del1 (2-2) written in it, the byte de-interleaver 25 actually reads only these delay groups del2 (2-1) and del1 (2-2).

Accordingly, the byte de-interleaver 25 outputs data comprised of the bytes classified as delay groups del0 (2-3), del1 (2-2), and del2 (2-1) as indicated by the third leftmost portion in FIG. 17D.

Similarly, in preparation for inputting the next byte interleave packet BIP', the byte de-interleaver 25 moves forward the reference address addr_base by another one block as indicated by the bold horizontal line in the fourth leftmost portion in FIG. 17B and, as indicated by the fourth leftmost portion in FIG. 17A, inputs the next byte interleave packet BIP' with packet No. "3" and, as indicated by the fourth leftmost portion in FIG. 17B, classifies the bytes that constitute this byte interleave packet BIP' into four three-byte groups del0 (3-3), del1 (0-2), del2 (1-1), and del3 (2-0) on the basis of count value cnt_del given by the first counter.

Then, the byte de-interleaver 25 generates a write address in such a manner as to, as indicated by the fourth leftmost portion in FIG. 17C, avoid writing to the DPRAM the bytes of delay group del0 (3-3) of these four delay groups del0 (3-3), del1 (0-2), del2 (1-1), and del3 (2-0) and, instead, write the bytes belonging to delay groups del1 (0-2) to region w3 which is two blocks behind the reference addr_base in the DPRAM, the bytes belonging to delay group del2 (1-1) to region w2 which is (2+3) blocks behind the reference address addr_base in the DPRAM, the bytes belonging to delay group del3 (2-0) to a region which is (2+3+4) blocks behind the reference address addr_base in the DPRAM, that is, the circulated beginning region w1.

At this moment, details of the data mapped to the addresses in the DPRAM are such as shown in FIG. 18. That is, in the byte de-interleaver 25, as for the regions that can store three-byte blocks of addresses 0-2, delay group del3 (3-0) which has packet No. "3" and the number of delay packets "3" is stored, in which the bytes belonging to these delay groups are written to the consecutive addresses starting from those having the lower numbered byte Nos. in such a manner that the data with byte No. "0" may be stored in a region of address 0, the data with byte No. "4" may be stored in a region of address 1, and the data with byte No. "8" may be stored in a region of address 2.

Further, the byte de-interleaver 25 generates a read address in such a manner as to, as indicated by the fourth leftmost portion in FIG. 17C, read the bytes belonging to delay group del0 of the four delay groups of del0, del1, del2, and del3 which are written to DPRAM as they are because they are not written to the DPRAM, the bytes belonging to delay group del1 from region r3 which is one block behind the reference address addr_base in the DPRAM, the bytes belonging to delay group del2 from region r2 which is (1+2) blocks behind the reference address addr_base in the DPRAM, and the bytes belonging to delay group del3 from region r1 which is (1+2+3) blocks behind the reference address addr_base in the DPRAM. In this case, region r1 is the same as region w1 at the time when a byte interleave packet BIP' with packet No. "0" is input, region r2 is the same as region w2 at the time when a byte interleave packet BIP' with packet No. "1" is input, and region r3 is the same as region w3 at the time when a byte interleave packet BIP' with packet No. "2" is input and has delay groups del3 (3-0), del2 (3-1), and del1 (3-2) written in it, so that the byte de-interleaver 25 actually reads these delay groups del3 (3-0), del2 (3-1), and del1 (3-2).

Accordingly, the byte de-interleaver 25 outputs data comprised of the bytes classified as delay groups del0 (3-3), del1 (3-2), del2 (3-1), and del3 (3-0) as indicated by the fourth leftmost portion in FIG. 17D.

In such a manner, the byte de-interleaver 25 classifies the bytes into the delay groups corresponding to an output after interleaving shown in FIG. 14D each time a byte interleave packet BIP' is input and, based on write and read addresses in accordance with the above-mentioned address generation system, performs managed write and read operations to the consecutive addresses on a memory map in the DPRAM for each of the delay groups. With this, like the byte interleaver 12, the byte de-interleaver 25 can immediately write the next data to the data storage region from which data is read and on which de-interleaving is performed completely, as a region to which the next data is written. That is, it is possible to eliminate a useless region (i.e., a region on which interleaving is performed completely and in which data is left as written) of the DPRAM regions, thus minimizing a required capacity of the DPRAM. In this case, although typically the byte de-interleaver 25 requires such a DPRAM as to have a capacity equal to a product of a depth D (=4) of folding de-interleaving and the number of bytes N (=12) per input packet, that is, D×N (=4×12=48) bytes, it can use such a DPRAM as to have a capacity of only nine three-byte regions, that is, 27 bytes as shown in FIG. 17C by performing the above-mentioned address control, to perform the similar folding de-interleaving. Further, the byte de-interleaver 25 can perform a write operation to consecutive addresses for each of the classified delay groups and a read operation to these consecutive addresses for each of the written delay groups, thereby easily calculating a write address and a read address.

As described above, to perform folding interleaving or folding de-interleaving with a depth of 4 and a period of 3 by inputting 12-byte packets in units of a byte, the byte interleaver 12 and the byte de-interleaver 25 may handle the data for each delay group by having a first counter for giving, for each packet, count value cnt_del (0-3) that corresponds to a depth 4 of folding interleaving or folding de-interleaving according to a byte No. of each of the bytes that constitute an incoming packet and a second counter for giving, for each packet, count value cnt_block (0-2) that corresponds to a period of this first counter.

Next, operations in the case of performing the processing in units of a unit will be described as follows. As in the case of performing the processing in units of a byte, the byte interleaver 12 classifies such bytes of an arbitrary encoded packet EP that these bytes may have the same number of delay packets that is the number of delays of a byte interleave packet BIP in which these bytes are stored in units of a unit when folding interleaving is performed on this encoded packet EP, into one delay group. Furthermore, it handles data for each of these delay groups by generating a write address and a read address so that write and read operations may be performed to consecutive addresses in the DPRAM for each of the delay groups.

To classify the bytes of a certain encoded packet EP into such a delay group, the byte interleaver 12, as in the case of performing the processing in units of a byte, is provided with two auxiliary counters for assisting in calculation of write and read addresses used to perform data write and read operations to the DPRAM. Furthermore, since one unit provides a unit of plural consecutive bytes, it is provided with an auxiliary counter for counting the byte in one unit.

Specifically, assuming that incoming 24-byte encoded packets EP are assigned packet Nos. 0, 1, 2, 3, . . . as shown in FIG. 19A and bytes of each of these encoded packets EP are assigned byte Nos. 0-23 as shown in FIG. 19B, the byte interleaver 12 is provided with, as auxiliary counters, a third counter for counting for each of the packets by incrementing count value cnt_byte (0-1) that corresponds to the number of bytes in one unit as shown in FIG. 19C, a first counter for counting for each of the packets by incrementing count value cnt_del (0-3) that corresponds to a depth 4 of folding interleaving as shown in FIG. 19D, and a second counter for counting for each of the packets by incrementing count value cnt_block (0-2) that corresponds to a period of the first counter as shown in FIG. 19E.

The byte interleaver 12 uses such count value cnt_del given by the first counter, count value cnt_block given by the second counter, and further count value cnt_byte given by the third counter, to control data write and read operations to the DPRAM, thereby performing folding interleaving on the encoded packets EP. In this case, the byte interleaver 12, when having received encoded packets to undergo folding interleaving, starts writing data to the DPRAM immediately, while it starts reading data from the DPRAM simultaneously with data writing or as delayed by a predetermined fixed number of clock. When having received an encoded packet EP, to avoid such a situation that significant data written to the DPRAM may be overwritten by any other data before the significant data is read, the byte interleaver 12 needs to read all the data completely before the next encoded packet EP is input after the data has been written to the DPRAM.

If it is here supposed to perform write and read operations of the bytes classified into the delay groups in units of a unit, as in the above-mentioned case of FIGS. 14A-14D, the byte interleaver 12 can perform to the DPRAM the write and read operations of the bytes classified into the delay groups. Note here that although data mapped to the addresses in the DPRAM at a moment when an encoded packet EP with packet No. "3" is input becomes such as shown in FIG. 15 if the processing is performed in units of a byte, when it is performed in units of a unit, the processing unit is switched from one byte to one unit (=two bytes), so that the data becomes such as shown in FIG. 20. That is, in the byte interleaver 12, as for the regions that can store three units of data of addresses 0-5, the consecutive bytes of the units belonging to the delay groups are written to the consecutive addresses starting from those having the lower numbered byte Nos. in such a manner that delay group del3 (0-3), which has packet No. "0" and the number of delay packets "3", is stored, in which items of data "6, 7" of the fourth unit are stored consecutively in a region of addresses 0 and 1, items of data "14, 15" of the eighth unit are stored consecutively in a region of addresses 2 and 3, and items of data "22, 23" of the 12'th unit are stored consecutively in a region of addresses 4 and 5.

In such a manner, the byte interleaver 12 classifies the bytes into the delay groups in units of a unit each time an encoded packet EP is input and, based on write and read addresses in accordance with the above-mentioned address generation system, performs managed write and read operations to the consecutive addresses on a memory map in the DPRAM for each of the delay groups. With this, the byte interleaver 12 can immediately write the next data to the data storage region from which data is read and on which interleaving is performed completely, as a region to which the next data is written. That is, it is possible to eliminate a useless region regarded as a region already used in the DPRAM, thus minimizing a required capacity of the DPRAM.

In this case, although typically the byte interleaver 12 requires such a DPRAM as to have a capacity equal to a product of a depth D (=4) of folding interleaving and the number of bytes N (=24) per input packet, that is, D×N (=4×24=96) bytes, it can use such a DPRAM as to have a capacity of only nine six-byte regions, that is, 54 bytes by performing the above-mentioned address control, in order to perform the similar folding interleaving. Further, the byte interleaver 12 can perform a write operation to consecutive addresses for each of the classified delay groups and a read operation to these consecutive addresses for each of the written delay groups, thereby easily calculating a write address and a read address.

Next, the byte de-interleaver 25 will be described. The byte de-interleaver 25, like the byte interleaver 12, classifies bytes that constitute a byte interleave packet BIP' into delay groups and handles data for each of these delay groups, to perform address control symmetrical to that of the byte interleaver 12, thereby performing folding de-interleaving.

That is, the byte de-interleaver 25, like the byte interleaver 12, is provided with, as the address generation portion, three auxiliary counters, although not shown, for assisting in calculation of write and read addresses used to perform data write and read operations to the DPRAM. Specifically, assuming that incoming byte interleave packets BIP' of 24 bytes are assigned packet Nos. 0, 1, 2, 3, . . . as shown in FIG. 21A and bytes of each of these byte interleave packets BIP' are assigned byte Nos. 0-23 as shown in FIG. 21B, the byte de-interleaver 25 is provided with, as auxiliary counters, a third counter for counting for each of the packets by incrementing count value cnt_byte (0-1) that corresponds to the number of bytes in one unit as shown in FIG. 21C, a first counter for counting for each of the packets by incrementing count value cnt_del (0-3) that corresponds to depth 4 of folding interleaving as shown in FIG. 21D, and a second counter for counting for each of the packets by incrementing count value cnt_block (0-2) that corresponds to a period of the first counter as shown in FIG. 21E.

Note here that it differs from the byte interleaver 12 in that count value cnt_del given by the first counter is not incremented but decremented.

Like the byte interleaver 12, the byte de-interleaver 25 uses such count value cnt_del given by the first counter, count value cnt_block given by the second counter, and count value cnt_byte given by the third counter, to control data write and read operations to the DPRAM, thereby performing folding de-interleaving on the byte interleave packets BIP'. The byte de-interleaver 25, when having received the byte interleave packets BIP' to undergo folding de-interleaving, starts writing data to the DPRAM immediately, while it starts reading data from the DPRAM simultaneously with data writing or as delayed by a predetermined fixed number of clock pulses. When having received a byte interleave packet BIP', to avoid such a situation that significant data written to the DPRAM may be overwritten by any other data before the significant data is read, the byte de-interleaver 25 needs to read all the data completely before the next byte interleave packet BIP' is input after the data is written to the DPRAM.

Note here that, when having received the byte interleave packets BIP' comprised of a data array output from the byte interleaver 12, the byte de-interleaver 25 can perform write and read operations of bytes classified into delay groups to the DPRAM in units of a unit, thereby performing write and read operations of the bytes classified into the delay groups to the DPRAM similar to the above-mentioned case shown in FIGS. 17A-17D. Note here that although data mapped to the addresses in the DPRAM at a moment when an encoded packet EP with packet No. "3" is input becomes such as shown in FIG. 18 if the processing is performed in units of a byte, if it is performed in units of a unit, the processing unit is switched from one byte to one unit (=two bytes), so that the data becomes such as shown in FIG. 22.

That is, in the byte interleaver 12, as for the regions that can store three units of data of addresses 0-5, the consecutive bytes of the units belonging to the delay groups are written to the consecutive addresses starting from those having the lower numbered byte Nos. in such a manner that delay group del3 (0-3) which has packet No. "0" and the number of delay packets "3" is stored, in which items of data "6, 7" of the fourth unit are stored consecutively in a region of addresses 0 and 1, items of data "14, 15" of the eighth unit are stored consecutively in a region of addresses 2 and 3, and items of data "22, 23" of the 12th unit are stored consecutively in a region of addresses 4 and 5.

That is, in the byte de-interleaver 25, as for the regions that can store six bytes of data of addresses 0-5, the consecutive bytes of the units belonging to the delay groups are written to the consecutive addresses starting from those having the lower numbered byte Nos. in such a manner that delay group del3 (0-3) which has packet No. "3" and the number of delay packets "3" is stored, in which items of data "0, 1" of the first unit are stored consecutively in a region of addresses 0 and 1, items of data "8, 9" of the fifth unit are stored consecutively in a region of addresses 2 and 3, and items of data "16, 17" of the ninth unit are stored consecutively in a region of addresses 4 and 5.

In such a manner, the byte de-interleaver 25 classifies the bytes into the delay groups each time a byte interleave packet BIP' is input and, based on write and read addresses in accordance with the above-mentioned address generation system, performs managed write and read operations to the consecutive addresses on a memory map in the DPRAM for each of the delay groups. With this, like the byte interleaver 12, the byte de-interleaver 25 can immediately write the next data to the data storage region from which data is read and on which interleaving is performed completely, as a region to which the next data is written. That is, it is possible to eliminate a useless region regarded as a region already used in the DPRAM, thus minimizing a required capacity of the DPRAM.

In this case, although typically the byte de-interleaver 25 requires such a DPRAM as to have a capacity equal to a product of a depth D (=4) of folding de-interleaving and the number of bytes N (=24) per input packet, that is, D×N (=4×24=96) bytes, it can use such a DPRAM as to have a capacity of only nine six-byte regions, that is, 54 bytes by performing the above-mentioned address control, in order to perform the similar folding interleaving as shown in FIG. 17C. Further, the byte de-interleaver 25 can perform a write operation to consecutive addresses for each of the classified delay groups and a read operation to these consecutive addresses for each of the written delay groups, thereby easily calculating a write address and a read address.

As described above, to perform folding interleaving or folding de-interleaving with a depth of 4 and a period of 3 on 24-byte encoded packets Ep in units of a unit by using two bytes as one unit, the byte interleaver 12 and the byte de-interleaver 25 may handle the data for each delay group by having a first counter for giving, for each packet, count value cnt_del (0-3) that corresponds to a depth of folding interleaving or folding de-interleaving according to a byte No. of each of the bytes that constitute an incoming packet, a second counter for giving, for each packet, count value cnt_block (0-2) that corresponds to a period of this first counter, and a third counter for giving, for each packet, count value cnt_byte (0-1) that corresponds to the number of bytes in each unit.

Therefore, assuming that the number of bytes per incoming packet to be N, a depth of folding interleaving or folding de-interleaving to be D, a period of folding interleaving or folding de-interleaving to be C, and the number of bytes contained in each unit when folding interleaving is performed to be U, the byte interleaver 12 and the byte de-interleaver 25 may perform data write and read operations to the DPRAM for each delay group by having a first counter for giving, for each packet, count value cnt_del (0 through D-1) that corresponds to depth D of folding interleaving or folding de-interleaving according to a byte No. of each of the bytes that constitute an incoming packet, a second counter for giving, for each packet, count value cnt_block (0 through C-1) that corresponds to a period of this first counter, and a third counter for giving, for each packet, count value cnt_byte (0-1) that corresponds to the number of bytes in each unit. That is, the address generation system by the byte interleaver 12 and the byte de-interleaver 25 can be generalized as follows.

Figure 23:
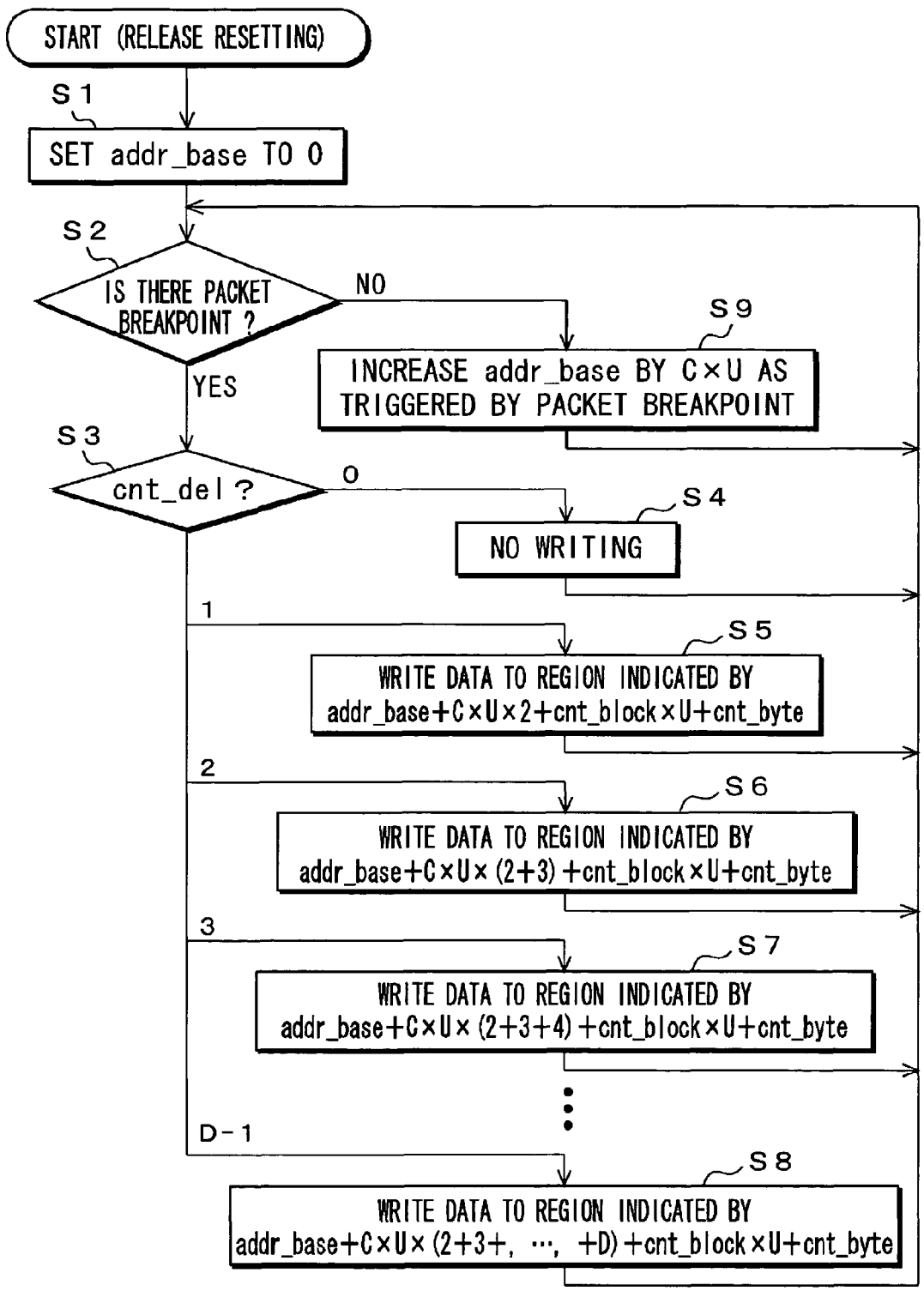
FIG. 23 is a flowchart for showing an operation of generating a write address used to write data to the DPRAM.

First, the byte interleaver 12 and the byte de-interleaver 25, to write data to the DPRAM, each generate a write address that corresponds to each delay group according to rules indicated by a series of processing steps shown in FIG. 23, thereby controlling data writing to the DPRAM.

That is, as shown in FIG. 23, the byte interleaver 12 and the byte de-interleaver 25 each set the above-mentioned reference address addr_base to "0" at step S1 and, at step S2, decide whether there is a packet breakpoint to undergo folding interleaving or folding de-interleaving.

If it is decided that there is no packet breakpoint, the byte interleaver 12 and the byte de-interleaver 25 each operate the first, second, and third counters to write the bytes for each delay group to the DPRAM on the basis of count value cnt-del given by the first counter.

That is, the byte interleaver 12 and the byte de-interleaver 25, if count value cnt_del by the first counter 1 is set to "0" at step S3, each classify the current byte into delay group del0 and, at step S4, generate no write address and go to step S2 without writing the bytes belonging to delay group del0 to the DPRAM.

Further, the byte interleaver 12 and the byte de-interleaver 25, if count value cnt_del by the first counter is set to "1" at step S3, each classify the current byte into delay group del1 and, at step S5, generate the following:

(addr_base+C×U×2+cnt_block×U+cnt_byte)

as a write address to write the bytes belonging to delay group del1 to a region indicated by this write address and go to step S2.

Furthermore, if count value cnt_del by the first counter is set to "2" at step S3, the byte interleaver 12 and the byte de-interleaver 25 each classify the current byte into delay group del2 and, at step S6, generate the following:

(addr_base+C×U×(2+3)+cnt_block×U+cnt_byte)

as a write address to write the bytes belonging to delay group del2 and go to step S2.

Furthermore, if count value cnt_del is set to "3" at step S3, the byte interleaver 12 and the byte de-interleaver 25 each classify the bytes into delay group del3 and, at step S7, generate the following:

(addr_base+C×U×(2+3+4)+cnt_block×U+cnt_byte)

as a write address to write the bytes belonging to delay group del3 to a region indicated by this write address and go to step S2.

If count value cnt_del by the first counter is set to "D-1" at step S3, the byte interleaver 12 and the byte de-interleaver 25 each classify the current byte into delay group del (D-1) and, at step S8, generate the following:

(addr_base+C×U×(2+3+. . . +D)+cnt_block×U+cnt_byte)

as a write address to write the bytes belonging to delay group del (D-1) to a region indicated by this write address and go to step S2.

The byte interleaver 12 performs such an operation by incrementing count value cnt_del from "0" to "D-1" until count value cnt_del becomes "D-1" and repeats this operation as many times as a value of the period C of folding interleaving, to end the processing on all of the bytes of each packets. The byte de-interleaver 25, on the other hand, performs such an operation by decrementing count value cnt_del from "D-1" to "0" until count value cnt_del becomes "0" and repeats this operation as many times as the value of the period C of the folding de-interleaving, to end the processing on all of the bytes of each packet.

In such a manner, the byte interleaver 12 and the byte de-interleaver 25 each end the processing on the incoming packet and, if it has decided at step S2 that there is a packet breakpoint, go to step S9. Then, the byte interleaver 12 and the byte de-interleaver 25 respectively increase at a packet breakpoint a value of the reference address addr_base by a value of "period C of folding interleaving or folding de-interleaving x the number of bytes U in unit", that is, by one block region at step S9 and go to step S2 again to wait for the next incoming packet.

The byte interleaver 12 and the byte de-interleaver 25 can each generate a write address for each delay group in accordance with such rules, to control data writing to the DPRAM. Note here that when performing folding interleaving in units of a byte, since each unit has "1" byte, setting U=1 and cnt_byte=0 in the above-mentioned general expression of the read address provides an expression for performing folding interleaving and folding de-interleaving in units of a byte. Further, in this case, the third counter is unnecessary.

Figure 24:
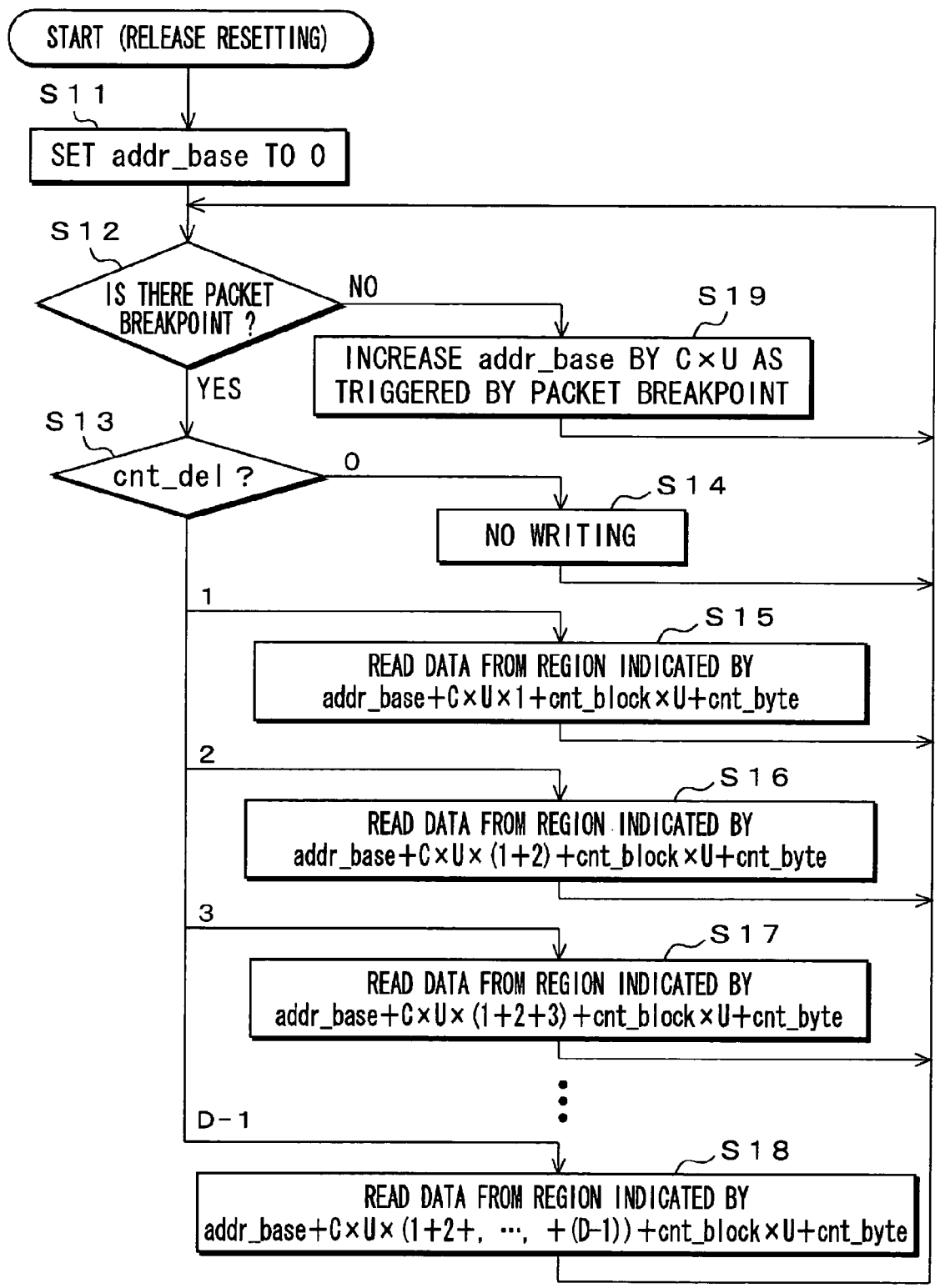
FIG. 24 is a flowchart for showing an operation of generating a read address used to read data from the DPRAM.

To read data from the DPRAM, on the other hand, the byte interleaver 12 and the byte de-interleaver 25 each generate a read address that corresponds to each delay group according to rules indicated by a series of processing steps shown in FIG. 24, thereby controlling a data reading operation from the DPRAM.

That is, as shown in FIG. 24, the byte interleaver 12 and the byte de-interleaver 25 each set the above-mentioned reference address addr_base to "0" at step S11 and, at step S12, decide whether there is a packet breakpoint to undergo folding interleaving or folding de-interleaving.

If it is decided that there is no packet breakpoint, the byte interleaver 12 and the byte de-interleaver 25 each operate the first and second counters to read the bytes for each delay group from the DPRAM on the basis of count value cnt_del given by the first counter.

That is, the byte interleaver 12 and the byte de-interleaver 25, if count value cnt_del by the first counter 1 is set to "0" at step S13, each classify the current byte into delay group del0 and, at step S14, generate no read address and output the bytes belonging to delay group del0 as they are, then going to step S12 without writing them to the DPRAM.

Further, the byte interleaver 12 and the byte de-interleaver 25, if count value cnt_del by the first counter is set to "1" at step S13, each generate the following:

(addr_base+C×U×1+cnt_block×U+cnt_byte)

as a write address at step S15 to read as delay group del1 the bytes stored in a region indicated by this read address and go to step S12.

Furthermore, if count value cnt_del by the first counter is set to "2" at step S13, the byte interleaver 12 and the byte de-interleaver 25 each generate the following:

(addr_base+C×U×(1+2)+cnt_block×U+cnt_byte)

as a read address at step S16 to read as delay group del2 the bytes stored in a region indicated by this read address and go to step S12.

Furthermore, if count value cnt_del is set to "3" at step S13, the byte interleaver 12 and the byte de-interleaver 25 each generate the following:

(addr_base+C×U×(1+2+3)+cnt_block×U+cnt_byte)

as a read address at step S17 to read as delay group del3 the bytes stored in a region indicated by this read address and go to step S12.

If count value cnt_del by the first counter is set to "D-1" at step S13, the byte interleaver 12 and the byte de-interleaver 25 each generate the following:

(addr_base+C×U×(1+2+. . . (D-1))+cnt_block×U+cnt_byte)

as a read address at step S18 to read as delay group del (D-1) the bytes stored in a region indicated by this read address and go to step S12.

The byte interleaver 12 performs such an operation by incrementing count value cnt_del from "0" to "D-1" until count value becomes "D-1" and repeats this operation as many times as a value of the period C of folding interleaving, to end the processing on all of the bytes of each packets. The byte de-interleaver 25, on the other hand, performs such an operation by decrementing count value cnt_del from "D-1" to "0" until count value cnt_del becomes "0" and repeats this operation as many times as the value of the period C of the folding de-interleaving, to end the processing on all of the bytes of each packet.

In such a manner, the byte interleaver 12 and the byte de-interleaver 25 each end the processing on the input packet and, if it has decided at step S12 that there is a packet breakpoint, go to step S19. Then, the byte interleaver 12 and the byte de-interleaver 25 respectively increase at a packet breakpoint the value of the reference address addr_base by a value of "period C of folding interleaving or folding de-interleaving x the number of bytes U in unit", that is, by one block region at step S19 and go to step S12 again to wait for the next incoming packet.

The byte interleaver 12 and the byte de-interleaver 25 can each generate a read address for each delay group in accordance with such rules, to control a data reading operation from the DPRAM. Note here that when performing folding interleaving in units of a byte, since each unit has "1" byte, setting U=1 and cnt_byte=0 in the above-mentioned general expression of the read address provides an expression for performing folding interleaving and folding de-interleaving in units of a byte. Further, in this case, the third counter is unnecessary.

The byte interleaver 12 and the byte de-interleaver 25, respectively, can perform folding interleaving or folding de-interleaving with a depth of D and a period of C on a packet comprised of N bytes by performing data write and read operations to the DPRAM in accordance with the rules shown in FIGS. 23 and 24. In this case, although typically the byte interleaver 12 and the byte de-interleaver 25 require such a DPRAM as to have a capacity of D×N number of bytes, they only need to use such a DPRAM as to have a capacity of C×(2+3+, . . . , +D)=C×((1+D)×D/2-1) number of bytes by performing such data write and read operations. Specifically, to perform folding interleaving or folding de-interleaving with a depth of 4 and a period of 3 in units of a byte on a packet comprised of 12 bytes as in the example shown in FIGS. 13A-24A, typically the byte interleaver 12 and the byte de-interleaver 25 each require such a DPRAM as to have a capacity of D×N=4×12=48 bytes as described above, but by performing the above-mentioned operations, it only needs to have such a DPRAM as to have a capacity of C×(2+3+, . . . , +D)=C×((1+D)×D/2-1)=3×((1+4)×4/2-1)=27 bytes; further, to perform folding interleaving or folding de-interleaving with a depth of 18 and a period of 12 on a packet comprised of 216 bytes as in the example shown in FIGS. 2A-12F, typically the byte interleaver 12 and the byte de-interleaver 25 each require such a DPRAM as to have a capacity of D×N=18×216=3888 bytes, but by performing the above-mentioned operations, they only need to have such a DPRAM as to have a capacity of C×(2+3+, . . . , +D)=C×((1+D)×D/2-1)=12×((1+18)×18/2-1)=2040 bytes.

Further, to perform folding interleaving or folding de-interleaving in units of a unit with a depth of 4 and a period of 3 by using two bytes as one unit on a packet comprised of 24 bytes, typically the byte interleaver 12 and the byte de-interleaver 25 each require such a DPRAM as to have a capacity of D×N=4×24=96 bytes as described above, but by performing the above-mentioned operations, it only needs to have such a DPRAM as to have a capacity of C×U×(2+3+, . . . , +D)=C×U((1+D)×D/2-1)=3×2×((1+4)×4/2-1)=54 bytes; further, to perform folding interleaving or folding de-interleaving with a depth of 18 and a period of 3 on a packet comprised of 216 bytes by using four bytes as one unit as in the example shown in FIGS. 2A-12F, typically they each require such a DPRAM as to have a capacity of D×N=18×216=3888 bytes, but by performing the above-mentioned operations, they only need to have such a DPRAM as to have a capacity of C×U(2+3+, . . . , +D)=C×U((1+D)×D/2-1)=3×4×((1+18)×18/2-1)= 2040 bytes.

In such a manner, the byte interleaver 12 and the byte de-interleaver 25 only need to have such a memory as to have about half a typically required memory capacity, thereby enabling the required memory capacity to be largely reduced.

As described above, in a data transmission/reception system according to the best mode, the encoder 10 can perform folding interleaving in units of a byte or a unit and interleaving in units of a packet, to achieve a large depth of the interleaving by using a small capacity memory, thereby transmitting transmit data TD that enables even an error correction code with a small code length to correct a significant burst error containing a packet loss. The decoder 20 in the data transmission/reception system, on the other hand, can completely correct a significant burst error containing a packet loss by performing de-interleaving in units of a packet that corresponds the encoder 10 and folding de-interleaving in units of a byte or a unit on the receive data RD received from the encoder 10.

The present invention is not limited to the above-mentioned mode. For example, although in the above-mentioned mode, the portions including the byte interleaver 12 and the packet interleaver 13 or those including the packet de-interleaver 24 and the byte de-interleaver 25 have each been mounted as a programmable device, the present invention can be applied even to a case where they are mounted as a dedicated integrated circuit.

Further, although in the above-mentioned mode, a transport stream TS obtained by performing compression and encoding based on the MPEG-2 standard has been input to the encoder 10 and decoded by the decoder 20, the present invention can be applied to any packet communication as far as under such conditions that a beginning data word of a packet has a fixed value to be used in synchronous generation at the time of interleaving or de-interleaving in units of a packet and the packet has a fixed length.

Furthermore, although in the above-mentioned mode, a Reed-Solomon code has been used as the error correction code, the present invention can be applied to encoding and decoding by use of an arbitrary error correction code.

Further, although the above mode has been described with reference to an example where an error is corrected mainly when a packet loss has occurred, of course the present invention can be applied to the case of packet loss occurrence but also to the case where a significant burst error has occurred. Note here that of course the present invention enables an ordinary burst error and a random error to be corrected by performing processing similar to the conventional processing.

Furthermore, although the above mode has been described with reference to a data transmission/reception system provided with the encoder 10 for encoding packeted data and the decoder 20 for decoding data encoded by this encoder 10, the present invention can be applied not only to such encoder and decoder but also to any use where interleaving and de-interleaving are performed.

Of course, the present invention can thus be modified as far as it does not depart from its gist.

INDUSTRIAL APPLICABILITY

As described above, an interleaving device, interleaving method, a de-interleaving device, and de-interleaving method related to the present invention are useful to enable a significant burst error containing a packet loss by using an error correction code with a small code length when performing packet communication and well applicable to real-time communication etc., which. re-transmission of packet is not permitted, such as streaming reproduction of a video signal and/or an audio signal.

The invention claimed is:

1. An interleaving device comprising:
a first interleaving means for performing folding interleaving on first data comprised of plural input packets, in units of a data word or plural consecutive data words; and
a second interleaving means, directly receiving output from said first interleaving means, for performing interleaving, in units of a packet, on second data output by said first interleaving means, said second data comprised of plural packets, wherein an error correction code is added to each of the packets that constitute said first data, wherein each of the packets that constitute said first data is obtained by adding said error correction code to plural data blocks respectively that constitute a data stream obtained by performing compression and encoding.

2. The interleaving device according to claim 1, wherein said second interleaving means replaces a value of beginning data in a first packet of packet-unit interleave.

3. The interleaving device according to claim 2, wherein said beginning data is a sink byte in a header of a packet that constitutes said first data.

4. The interleaving device according to claim 1,
wherein said first interleaving means is installed by using first storage means incorporated in a programmable device; and
wherein said second interleaving means is installed by using second storage means externally attached to said programmable device.

5. The interleaving device according to claim 4, wherein said first storage means is a dual-port random access memory in which inconsecutive addresses are accessed in units of a data word at each clock synchronized with the data word.

6. The interleaving device according to claim 4, wherein said second storage means is a random access memory fitted to burst transfer of data in units of plural data words.

7. The interleaving device according to claim 6, wherein said second storage means is a synchronous dynamic random access memory.

8. The interleaving device according to claim 1, wherein said error correction code is a Reed-Solomon code.

9. The interleaving device according to claim 1, wherein said first interleaving means performs folding interleaving on said first data in units of a byte or plural consecutive bytes.

10. An interleaving method comprising:
a first interleaving step of performing folding interleaving on first data comprised of plural input packets, in units of a data word or plural consecutive data words; and
a second interleaving step of performing interleaving, in units of a packet, on second data directly generated by the first interleaving step, said second data comprised of plural packets, wherein an error correction code is added to each of the packets that constitute said first data, wherein each of the packets that constitute said first data is obtained by adding said error correction code to plural data blocks, respectively, that constitute a data stream obtained by performing compression and encoding.

11. The interleaving method according to claim 10, wherein in said second interleaving step, a value of beginning data in a first packet of packet-unit interleave is replaced.

12. The interleaving method according to claim 11, wherein said beginning data is a sink byte in a header of a packet that constitutes said first data.

13. The interleaving method according to claim 10,
wherein said first interleaving step is performed by using first storage means which is incorporated in a programmable device; and
wherein said second interleaving step is performed by using second storage means which is externally attached to the programmable device.

14. The interleaving method according to claim 13, wherein as said first storage means, a dual-port random access memory in which inconsecutive addresses are accessed in units of a data word at each clock synchronized with the data word is used.

15. The interleaving method according to claim 13, wherein as said second storage means, a random access memory fitted to burst transfer of data in units of plural data words is used.

16. The interleaving method according to claim 15, wherein as said second storage means, a synchronous dynamic random access memory is used.

17. The interleaving method according to claim 10, wherein said error correction code is a Reed-Solomon code.

18. The interleaving method according to claim 10, wherein in said first interleaving step, folding interleaving is performed on said first data in units of a byte or plural consecutive bytes.

* * * * *